US012283794B2

(12) United States Patent
Wallis et al.

(10) Patent No.: US 12,283,794 B2
(45) Date of Patent: Apr. 22, 2025

(54) POLARISED EMISSION FROM QUANTUM WIRES IN CUBIC GaN

(71) Applicants: Cambridge Enterprise Limited, Cambridge (GB); The University of Manchester, Manchester (GB)

(72) Inventors: David Wallis, Cambridge (GB); Rachel Oliver, Cambridge (GB); Menno Kappers, Cambridge (GB); Philip Dawson, Manchester (GB); Stephen Church, Manchester (GB); David Binks, Manchester (GB)

(73) Assignees: Cambridge Enterprise Limited, Cambridge (GB); The University of Manchester, Manchester (GB)

( * ) Notice: Subject to any disclaimer, the term of this patent is extended or adjusted under 35 U.S.C. 154(b) by 590 days.

(21) Appl. No.: 17/765,751

(22) PCT Filed: Sep. 30, 2020

(86) PCT No.: PCT/EP2020/077339
§ 371 (c)(1),
(2) Date: Mar. 31, 2022

(87) PCT Pub. No.: WO2021/064005
PCT Pub. Date: Apr. 8, 2021

(65) Prior Publication Data
US 2022/0368111 A1    Nov. 17, 2022

(30) Foreign Application Priority Data

Oct. 4, 2019   (GB) ...................................... 1914387
Jun. 29, 2020  (GB) ...................................... 2009922

(51) Int. Cl.
*H01S 5/34*     (2006.01)
*H01L 33/00*    (2010.01)
(Continued)

(52) U.S. Cl.
CPC ............ *H01S 5/341* (2013.01); *H01L 33/007* (2013.01); *H01L 33/06* (2013.01); *H01L 33/18* (2013.01);
(Continued)

(58) Field of Classification Search
CPC ....................................................... H01S 5/341
(Continued)

(56) References Cited

U.S. PATENT DOCUMENTS

2014/0014898 A1* 1/2014 Son ........................ H01L 33/58
257/13
2014/0054633 A1* 2/2014 Kim ...................... H01L 33/145
257/98

FOREIGN PATENT DOCUMENTS

GB        2529594       2/2016
WO    WO 2018/178315   10/2018

* cited by examiner

*Primary Examiner* — Ajay Arora
(74) *Attorney, Agent, or Firm* — Rudy J. Ng; Bozicevic, Field & Francis LLP

(57) ABSTRACT

A semiconductor structure comprising a matrix having a first cubic Group-III nitride with a first band gap, and a second cubic Group-III nitride having a second band gap and forming a region embedded within the matrix. The second cubic Group-III nitride comprises an alloying material which reduces the second band gap relative to the first band gap, a quantum wire is defined by a portion within the region embedded within the matrix, the portion forming a one-dimensional charge-carrier confinement channel, wherein the quantum wire is operable to exhibit emission luminescence which is optically polarised.

21 Claims, 11 Drawing Sheets

(51) Int. Cl.
  *H01L 33/06*     (2010.01)
  *H01L 33/18*     (2010.01)
  *H01L 33/32*     (2010.01)
  *H01S 5/343*     (2006.01)
  *H01S 5/183*     (2006.01)
(52) U.S. Cl.
  CPC .......... *H01L 33/32* (2013.01); *H01S 5/34333*
        (2013.01); *H01S 5/183* (2013.01)
(58) Field of Classification Search
  USPC .......................................................... 438/46
  See application file for complete search history.

POLARISED EMISSION FROM QUANTUM WIRES IN CUBIC GaN

TECHNICAL FIELD

This disclosure generally relates to cubic Group-III Nitride semiconductors that exhibit emission luminescence, in particular but not exclusively, to quantum wires in structures of cubic Group-III Nitride semiconductors.

BACKGROUND

GaN-related structures in the cubic/zincblende phase are known as a promising alternative to the more widely-known wurtzite/hexagonal GaN semiconductors, and may be used to achieve improved efficiencies for long-wavelength (including Green amber and red) LEDs. Semiconductors, such as those comprising GaN, are known to give rise to photo-luminescent and electro-luminescent properties, where such semiconductors may be used in LED or photo-diode devices. Group-III nitride semiconductors generally offer a wide range of optoelectronic applications including LEDs, and laser diodes emitting in the blue, green, and red spectral region. However, conventional LED sources still require separate polarisation filters when used in display technology, which inherently reduces the transmission of light, and thus reduces efficiency of the system. Thus, it would be advantageous to obtain a polarised light source for use in LD or LCD displays, or other such devices requiring a polarised light source.

Furthermore, semiconductors may be arranged to create a so-called 'quantum wire' (Qwire) by arrangement of regions of larger band gap and (relatively) smaller band gap-semiconductors. A quantum wire may generally be thought of as a region of material where charge carriers i.e. electrons and/or holes, are confined in two orthogonal dimensions, but are free to move in a third orthogonal dimension. This confinement of the charge carriers leads to formation of a series of quantised (or substantially quantised) energy states within in the Qwire.

It has been observed in the known art that Qwires may exhibit emission at low temperatures, however, the optical emission properties resulting from various cubic group-III nitride semiconductors, as described below, are generally unknown or not yet well understood in the state of the art.

SUMMARY

The present disclosure seeks to address the problem of reliably producing polarised light sources from semiconductor devices, particularly cubic Group-III Nitride semiconductor devices.

Quantum wires are one-dimensional (1D) structures, which exhibit quantum confinement of charge carriers in two dimensions (leaving charge carriers free to move in only 1 D). This is in contrast to quantum wells, which are two-dimensional (2D) structures which exhibit quantum confinement of charge carriers in one dimension (leaving charge carriers free to move in 2D), and to quantum dots, which are zero-dimensional structures (0D) in which charge carriers are confined in all possible dimensions.

In the following disclosure, it is demonstrated that it is possible to obtain polarised light emission from cubic-Group-III Nitride-based Quantum wires within Quantum wells. If this can be achieved in an LED structure then this offers a route to improved efficiency in display and other applications. Currently, standard (unpolarised) LEDs are used as backlighting sources for LCD displays. Since these displays rely on polarised light, currently this is achieved by placing a polarising film in front of the unpolarised light source meaning that as much as 50% of the light emitted from the standard backlighting source is wasted. If a polarised light source could be realised, this would advantageously mean that more of the emitted optical energy could be used in the display, thus resulting in more efficient displays. This in turn would extend battery life in portable devices. Therefore, polarised emission combined with the potential for improved efficiency (particularly at longer wavelengths such as green, amber and/or red) from cubic-GaN LEDs offer significant benefits in display applications. There are also a large range of other applications where polarised light sources are used, and therefore a range of other suitable application which would benefit from polarised cubic-GaN LEDs.

According to one aspect of the disclosure, there is provided a semiconductor structure comprising: a matrix comprising a first cubic Group-III nitride having a first band gap, and a second cubic Group-III nitride having a second band gap and forming a region embedded within the matrix, wherein the second cubic Group-III nitride comprises an alloying material which reduces the second band gap relative to the first band gap. The semiconductor structure further comprises a quantum wire defined by a portion within the region embedded within the matrix, the portion forming a one-dimensional charge-carrier confinement channel, wherein the quantum wire is operable to exhibit emission luminescence, which is optically polarised.

The portion within the region embedded within the matrix, which defines the quantum wire, may have a fraction of the alloying material, which is further increased relative to the remainder of the embedded region.

It will be understood by the skilled person that an alloying material may comprise one or more elements, and may be commensurate with the structure of the matrix (i.e. also cubic, and possibly having the same or substantially similar lattice constant). The alloying material may comprise an enrichment or indeed a depletion of an element, or elements, relative to the elements in the matrix. For example, the matrix may comprise a ternary material (e.g. AlGaN), and the lower-band gap embedded region may comprise a binary alloy (GaN). Thus, the alloying material is an enrichment of GaN relative to the matrix.

Additionally, the alloying material is preferably isovalent with the elements comprising the matrix. It will be further appreciated by the skilled person that an alloying material may comprise any increased proportion of a certain element. Merely for example, the matrix may comprise GaN, and the embedded region within the matrix may comprise InGaN wherein the In is in a proportion as low as 1%, or as high as 80%, though is not limited to being in this range and may be as high as 99%. In this case, the alloying material is Indium, which is provided as an enrichment in the embedded region, relative to the matrix. Alternatively, the matrix may comprise AlN, and the embedded region may comprise suitable matrix material alloyed to have lower band gaps, such as AlGaN, or BGaN.

It will be further understood that the cubic group-III Nitride matrix generally comprises a suitable combination comprised of (Al)(Ga)(In)(B)N, in a cubic structure. The embedded region within the matrix comprises an alloying material, and therefore comprises a suitable combination of (Al)(Ga)(In)(B)N, having elements in different proportions relative to the matrix, where the different proportions are such that the second band gap is lower than the first band gap. It will be understood that the different proportions resulting in a reduced bandgap also applies to the portion within the embedded region defining the quantum wire. Various suitable combinations that result in a reduced band gap are described in the following examples.

The above semiconductor structure may comprise any of the following features, alone or in combination:

The structure may further comprise: a quantum well defined by the region embedded within the matrix, wherein the region forms an embedded layer within the matrix.

According to the above, the matrix may comprise cubic gallium nitride, and the region embedded in the matrix may comprise cubic gallium nitride enriched with Indium. The Indium reduces the bandgap of the embedded region relative to the bandgap of the matrix. The quantum wire defined by the portion within the embedded region may comprise a region comprising a further enriched proportion of Indium relative to the embedded region. This further Indium-enriched region forms a charge carrier confinement channel where charge carriers are confined in 2 dimensions, wherein the quantum wire is operable to exhibit luminescent (e.g., photo-luminescent or electro-luminescent) emission which is optically polarised. Furthermore, the matrix may be formed into at least two layers, within which the embedded region is embedded, wherein the embedded region is a layer, which defines a quantum well.

The charge carrier confinement channel confines carriers such that they are free to move only in one dimension (1D), and the optically polarised light may be linearly polarised, where the plane of linear polarisation may be in a direction that is the same direction as an orientation of the quantum wire. Advantageously, the confinement of charge carriers in one dimension, which may be electrons (negative charge) or holes (positive charge carriers), causes polarised emission as a result of being confined or substantially confined to move in 1 dimension.

It will be understood that 'cubic' refers to the crystal structure Face Centred Cubic (FCC), or in other words a zincblende crystal structure. The crystal structure may be formed by combining any group III and Group V elements and preferably any Group III elements with Nitrogen, i.e. III-Nitrides. These group III elements can be Gallium, Indium, Aluminium or Boron and may be combined to form, binary, ternary, quaternary or penternary alloys, e.g. any combination of (Al)(Ga)(In)(B)N. The alloy material may generally be any suitable group III element or elements, preferably such that the alloying/enriching elements are not so large as to disrupt the lattice's stability. Moreover, as mentioned above, the alloy material generally comprises at least one G-III element that results in a reduced second band gap relative to the matrix (having the first band gap).

The semiconductor structure may further comprise a quantum well defined by the region embedded in the matrix, wherein the embedded region forms a layer embedded within the matrix.

The embedded region may form a continuous channel or inclusion within the matrix. The embedded layer defining the quantum well may thus be a layer sandwiched between separated layers of the matrix. Furthermore, an orientation of a plane of the quantum well/embedded layer may be oriented in the same direction as an orientation of the quantum wire.

The alloying material of the semiconductor structure may be indium. In preferable embodiments, the fraction of indium in the embedded region (relative to the GaN in the matrix) may be between about 0.01 and 0.40 (1% and 40%).

The portion of the embedded region defining the quantum wire may comprise a local increase in the concentration of the alloying material. That is, the quantum wire may comprise an increased proportion of an alloying material, relative to a proportion of alloying material in the remainder of the embedded region's composition.

Furthermore, the local increase in the concentration of alloying material may be local to an intersection between a stacking fault in the semiconductor structure and the quantum well. In some examples, the alloying material fraction concentration (which may be indium) may be approximately double the average fraction of alloying material in the embedded region/layer.

The portion of the embedded region defining the quantum wire may also/alternatively comprise a local fluctuation in a width of the embedded layer defining the quantum well. It will be understood that said fluctuation in width of the embedded layer causes confinement of the charge carriers so that they can largely move only in one dimension, which results in a quantum wire operable to deliver polarised emission.

A dimension of the local fluctuation may preferably be greater than 2 nm.

Changes in well width above about 2 and 3 nm, depending on initial quantum well-width, results in energy difference between electron ground states that exceeds the amount of energy required to thermally occupy the higher electronic state. Thus, advantageously, electrons will be well confined since thermal excitation will be low, and the intensity of the emission will be more temperature-independent.

In preferable examples, the width of the embedded layer defining the quantum well may fluctuate between widths of no less than 2 nm and no more than 14 nm. An average width of the quantum well may be between about 4 nm and 8 nm.

Furthermore, charge carriers confined in the carrier confinement channel of the quantum wire are preferably electrons. That is, electrons are more likely to be strongly confined to move only in one dimension within the well-width fluctuations. Holes may not be confined strongly by the well width fluctuations.

The portion of the embedded region defining the quantum wire may alternatively be defined by a channel of the embedded region comprising the alloying material, the channel extending through the matrix. In other words, the quantum wire may be defined by a portion of the embedded region having the alloying material, which forms a physical wire-like structure, or passage, or channel, through or within the matrix.

Generally, a fraction of alloying material in the embedded region may be greater than around 20%, in particular when the embedded region forms an embedded layer within the matrix, thus defining a quantum well. In some examples, the matrix is GaN and the region embedded in the matrix is InGaN, wherein the alloying material is In. As mentioned above, the alloying material may comprise an enrichment or indeed a depletion of an element, or elements, relative to the elements in the matrix. Moreover, it will be understood that in order to effect a decrease in the band gap of the region embedded in the matrix, only certain alloying materials are suitable depending on the matrix. For example, alloying GaN with In will result in a reduced bandgap, however, alloying GaN with Al would result in an increased bandgap. Further example are given in the following description.

Advantageously, higher indium contents in quantum wires reduce the temperature-dependence on the degree of polarisation of the emission. In other words, the energy splitting between a first state, which may be a ground state, and a second state, which may be an excited state, is enlarged, thus reducing thermal excitation and reducing thermal occupation into the excited state.

More generally, the carrier confinement channel of the quantum wire may possess a first electronic state and a second electronic state, wherein a difference in energy between the aforementioned states is greater than a characteristic thermal energy, which reduces a likelihood of a thermally induced transition between the states. This difference in energy may be greater than around 25 meV in certain examples.

Again, advantageously, the difference in energy above 25 meV between these states (for example, an electronic ground state and an excited state) significantly reduces thermal excitation, thus reducing temperature dependence of the degree of polarisation. It will be understood that 26 meV is a typical thermal energy at room temperature and relates to the characteristic thermal energy. Alternatively, the first and second states may be a ground state of the quantum well (having theoretically infinite length) and a ground state of the local fluctuation behaving as a second quantum well with a finite length (thus acting as a charge carrier confinement channel).

In preferable embodiments, an average cross-sectional dimension of the quantum wire may be less than around 10 nm, and greater than around 2 nm. Dimensions of quantum wires of around 5 nm may be preferable. An average dimension or average cross-sectional dimension may refer to: a width in one lateral dimension of the wire, a mean average of the two lateral widths of the wire, a diagonal length between two corners of a quadrilateral defined by a cross section of the wire, or any suitable measure of a size of the cross-section of the quantum wire. It will be understood that the length of the wire will be larger relative to the wire's average cross-sectional dimension.

According to the examples above, in particular the preferred alloying compositions and Qwell dimensions, the present disclosure also seeks to address and overcome the problem of producing a semiconductor structure or device whose degree of polarisation and/or emission intensity is substantially independent of temperature. The cross-sectional dimensions of the Qwires can have an impact on the confinement of holes in two dimensions; increasingly larger quantum wires may reduce thermal excitation out of the Qwire, as the energy difference between the carrier ground state and the Qwell will be larger. However, larger Qwires may also increase the thermal occupation of any excited state in the Qwire, because the energy separation between ground and excited state in the wire may be lower. Increased thermal occupation of any excited stated may thus result in unfavourable temperature-dependent polarisation.

Thus, to ensure temperature independence of polarisation, smaller quantum wires may be preferred in some examples, for example, where the quantum wire is a result of the intersection between a stacking fault and a quantum well, and in other examples, a balance of size must be struck to balance the competing effects of reduced thermal excitation out of the Qwire, and increases thermal occupation of any excited state.

However, a wider Qwire will reduce thermal excitation out of the Qwire, as the energy difference between the carrier ground state and the Qwell will be larger. A wider Qwire will, however, increase the thermal occupation of any excited state in the wire as the energy separation between ground and excited state in the wire will be lower, resulting in a temperature-dependent polarisation According to a further related aspect of the invention, there is provided a semiconductor device incorporating the semiconductor structure according to any of the previously described aspects and examples, wherein the semiconductor device is selected from a group comprising: a vertical cavity surface emitting laser, VCSEL; a laser; a sensor.

The semiconductor device may further comprise a substrate comprising cubic silicon carbide (3C SiC), or alternatively a suitable cubic semiconductor such as silicon, GaAs or, in particular, the substrate may also be Silicon Carbide on Si, which may be 3C—SiC on [001] Si.

The device may further comprise an electron rich layer of matrix material, disposed on a surface of the substrate; an optically active region defined by the matrix and the region embedded within the matrix, disposed on a surface of the electron rich layer; and an electron deficient layer of matrix material disposed on a surface of the optically active region. This structure may generally represent an LED and may contain other elements or materials for strain relief, dislocation or point defect filtering, or control of carrier transport as known to those skilled in the art. It will further be understood that the semiconductor structure above, in relation to LEDs and the like, defines a diode (i.e. a p-n junction) which induces the optical activity/luminescence from the optically active region.

Generally, an electron deficient layer (alternatively, a hole-rich layer) relates to a p-type semiconductor layer, and an electron rich layer relates to an n-type semiconductor.

It will be understood that the optically active region is defined by the quantum well, i.e. the two layers of matrix material that embed a layer of lower band gap material, and also the quantum wires comprised within the quantum well which exhibit polarised emission. Furthermore, it will be appreciated that a plurality of optically active layers/quantum wells may be present in a device, such as an LED.

Furthermore, the substrate may comprise multiple layers such as ceramic or single crystal silicon with a Silicon carbide layer above, which in a preferable example may be cubic (3C) silicon carbide. Advantageously, a Silicon carbide on silicon substrate having a commensurate (cubic) crystal structure to the gallium nitride may allow direct fabrication of the GaN structure over the substrate. The diameter of the substrate may be 50 mm, 100 mm, 150 mm, 200 mm, 300 mm, or any size commensurate with the large volume manufacturing capability available in conventional wafer processing foundries.

Furthermore, the semiconductor structure may further comprise an optical confinement layer disposed on either side of the optically active region. This structure generally relates to a laser diode device structure.

According to another related aspect of the invention, there is provided a method of manufacturing a semiconductor device. This method comprises: forming a matrix comprising a first cubic Group-III nitride having a first band gap; forming a second cubic Group-III nitride having a second band gap and which forms a region embedded within the matrix, wherein the second cubic Group-III nitride comprises an alloying material which reduces the second band gap relative to the first band gap; and forming a portion within the region embedded within the matrix defining a quantum wire, the portion forming a one-dimensional charge-carrier confinement channel.

The method may further comprise forming the region embedded within the matrix as an embedded layer within the matrix, which defines a quantum well.

According to the above aspect, the formed semiconductor device may be selected from a group comprising: a light emitting diode (LED); a vertical cavity surface emitting laser, VCSEL; a laser; a sensor The method of manufacturing a semiconductor device may further comprise: forming a substrate comprising cubic silicon carbide; forming an electron rich layer of matrix material, disposed on a surface of the substrate; and forming an optically active region defined by the matrix and the region embedded within the matrix, disposed on a surface of the electron rich layer; forming an electron deficient layer of matrix material disposed on a surface of the optically active region.

The method of manufacturing the semiconductor device may yet further comprise forming optical confinement layers disposed on each of a first and second surface of the optically active region.

Further advantages related to emission properties (i.e. photo-luminescent or electro-luminescent) resulting from the following structures will become apparent in the following description. For example, light emitted from the surface of structures/devices as described is polarised, which enables LED made from semiconductor structures described herein to be used in a usual (surface emitting) format, and as such this obviates the need to fabricate an edge emitting LED device.

BRIEF DESCRIPTION OF THE EMBODIMENTS

These and other aspects of the disclosure will now be further described, by way of example only, with reference to the accompanying figures in which.

DETAILED DESCRIPTION OF THE EMBODIMENTS

The disclosure and specific embodiments of the disclosure will now be described with reference to the following non-limiting examples.

Figure 1:
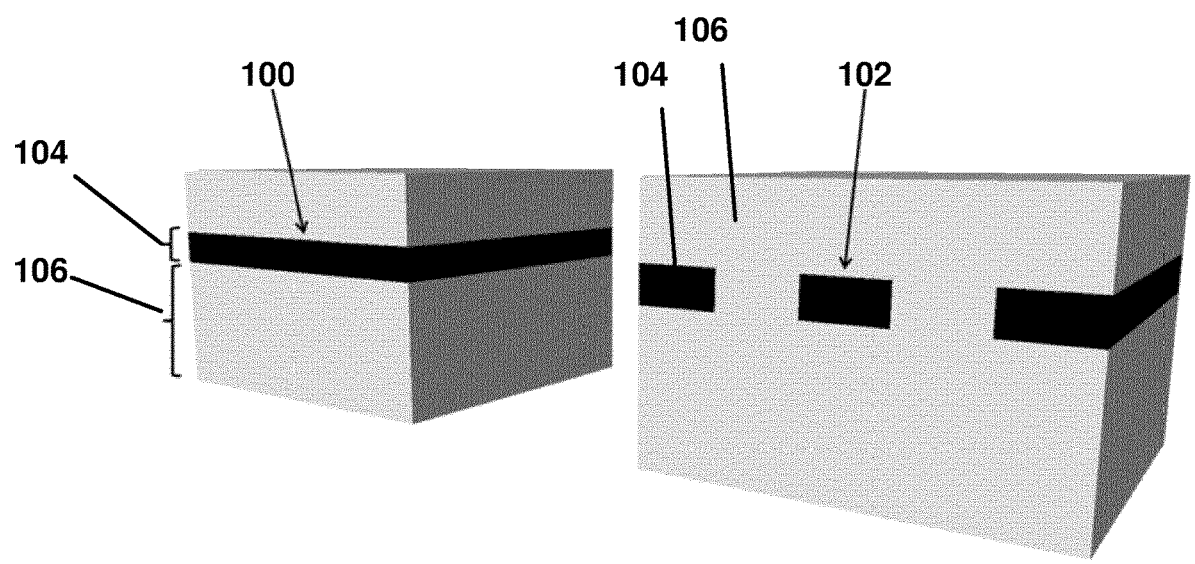
FIG. 1 illustrates a quantum well and quantum wire, respectively, formed from a low bandgap material encased in a higher bandgap material.

FIG. 1 shows a quantum well 100 (Qwell) and quantum wire 102 (Qwire), respectively, comprised within a semiconductor structure. Generally, a quantum well may be formed by sandwiching a low band gap material in between two higher-bandgap materials. In FIG. 1, the quantum well 100 is produced by encasing a layer of lower bandgap material 104, such as Gallium Nitride (GaN) further comprising an alloying element/material Indium, InGaN, between a higher bandgap matrix 106, such as Gallium Nitride. The Qwell 100 is generally formed by having the matrix material 106 of higher band gap embed/surround a layer of lower band gap material 104. The higher bandgap matrix material surrounding the embedded region may alternatively be referred to as a barrier.

Generally, any suitable group III element or elements (for example, Indium, when the matrix material 106 surrounding the Qwell is GaN) may be used to enrich the centre layer 104 in order to create a quantum well in a GaN semiconductor. The larger In atom has the effect of reducing the bandgap in the centre layer.

For example, other alternatives for the Qwell layer 104 (embedded region) and surrounding layer 106 (matrix) are: Ga enriched AlGaN (104) embedded in Ga deficient AlGaN (106); AlGaN (104) embedded in BGaN (106); and indium enriched InGaN (104) embedded in indium deficient InGaN (106). The composition of the low bandgap material (for example, InGaN) used on the Qwell layer 104 may vary anywhere between 2% to 40% indium, and more in some examples. Preferable examples for Indium fractions in GaN semiconductors are detailed below.

A Qwire may then be produced by removing lengths or portions of the lower-bandgap material 104 to create transverse channels 102 in which electrons may be confined in 2 dimensions, and free to move only in one dimension.

Qwires will be understood to conform to a variety of shapes and configurations, and are not limited to the Qwires as illustrated in the Figures. For example, other suitable Qwire-like structures exist which may be referred to as: truncated quantum wires; quantum dashes; stubby quantum wires; elongated quantum dots; or extended quantum dots.

Figure 2:
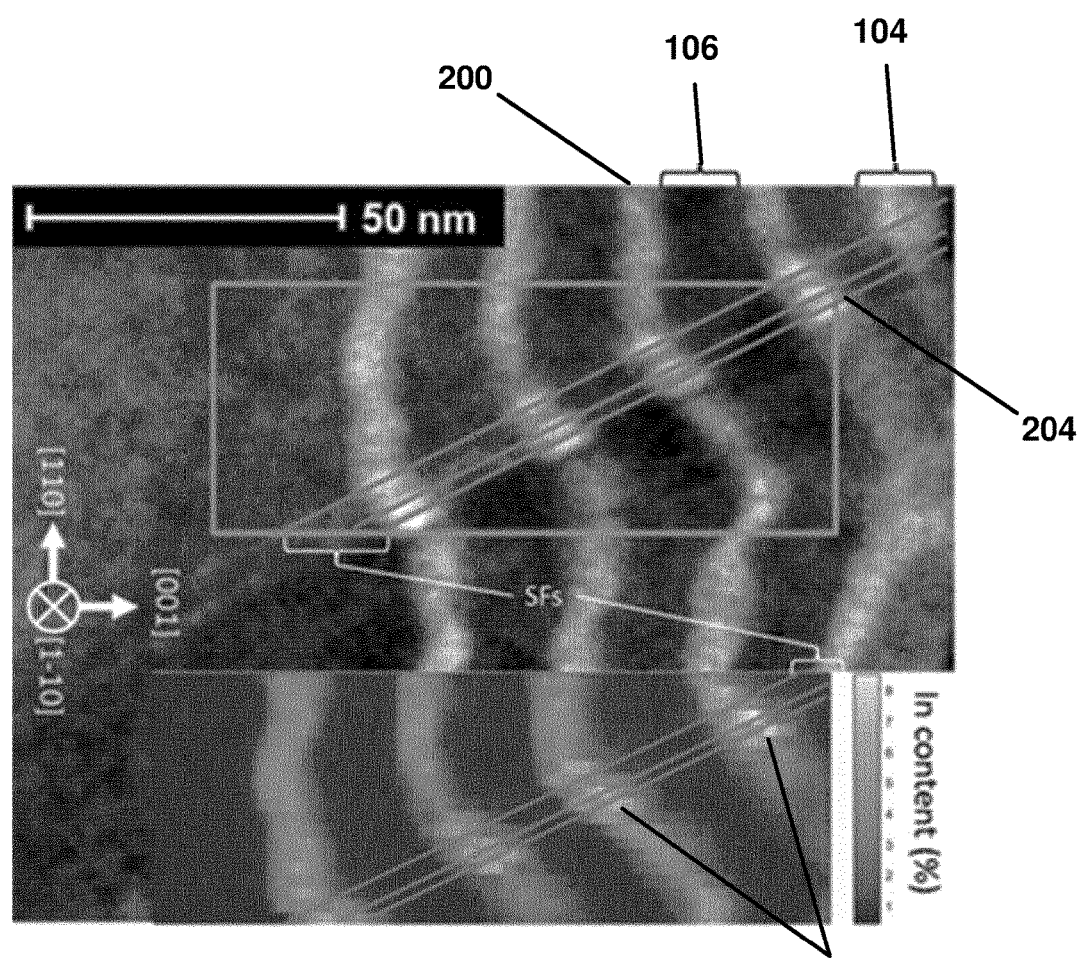
FIG. 2 shows a transmission electron microscope (TEM) image, with an inset having an energy dispersive X-ray (EDX) overlay, of a GaN and Indium Gallium Nitride (InGaN) structure such as illustrated in the general example of FIG. 1.

FIG. 2 shows an experimental transmission electron microscope (TEM) image, with an inset having an energy dispersive X-ray (EDX) overlay, of a GaN 106 and InGaN 104 structure, such as the one illustrated in the general example of FIG. 1. The Qwells 200 comprising Indium (In)-enriched GaN 104 align along the [110] direction of the GaN crystal as shown by the axis on the graph. Qwires 202 are formed in the shown image where the Qwells 200 intersect pre-existing stacking faults (SF) 204 in the underlying GaN crystal. The highlighted regions 202 in the EDX overlay are indicative of further enriched In regions. That is, at the intersection of the Qwells 200 with the stacking faults 204, the InGaN Qwells may become further enriched in Indium, which may give rise to Qwires 202.

The GaN crystal shown here is cubic, or zincblende, GaN (zb-GaN). Typically, the GaN crystal structure is naturally a hexagonal, or Wurtzite, structure since this is the thermodynamically stable state. Zb-GaN is a metastable state of GaN, which nevertheless may be fabricated under certain conditions. For example, the inventors have identified that zb-GaN may be grown on [001] surface of Silicon carbide on Silicon substrates, using (for example) metal organic vapour phase epitaxy (MOVPE), also known as metal organic chemical vapour deposition (MOCVD). Alternatively, other growth techniques such as Molecular Beam Epitaxy (MBE) or hydride vapour phase epitaxy (HVPE) could be used.

The TEM image in FIG. 2 reveals large distortions to the Qwell caused by the underlying roughness of the crystal (which is separate from the stacking faults). In this example, the average width of the Qwell is 8 nm, however, this width can vary between about 4 nm and 12 nm along the length of the Qwells. These width distortions only occur in one dimension (i.e. transverse to the length of the wire, in the [001] direction as shown) and may therefore result in additional carrier confinement. This would result in quantum wire (Qwire)-like structures going into the figure (in the [1-10] direction). Again, the emission from ground states in the Qwires results in polarized emission along the length of the wire. Modelling results from this width-distortion phenomena are discussed below in further details, in regards to FIG. 5.

Thus, generally, and as described below in greater detail, Qwires may be formed from an underlying crystal roughness, which creates local distortions or fluctuations in the width of a Qwell. Specifically, the temperature and annealing factors used to fabricate the cubic GaN crystals may be tuned to exploit anisotropic diffusion that is inherent to the components of the crystal. As a result, the crystal may form ridges or corrugations at a molecular level, which may cause fluctuations and/or stacking faults that contribute to the formation of quantum wires.

Alternatively, in FIG. 2, the stacking faults (SF) 204 intersect with the Qwells 200, and cause a local increase in the indium content of the well by up to a factor of 2. These result in Qwire-like structures in the highlighted In-rich regions shown 202. The direction of the Qwires produced is perpendicular to the surface of the crystal shown, i.e. going into the figure in the [1-10] direction. The Qwires thus confine electrons to 1 dimension in the [1-10] direction and produce polarised emission (i.e., photoluminescence (PL) or electro-luminescent emission). Modelling results from this stacking-fault phenomenon are discussed below in further detail, in regards to FIGS. 6, 7, and 8.

Moreover, SFs can be present in both [110] and [1-10] directions. This means that Qwires may also be present in both directions. Therefore, light arising from [110] Qwires will be polarised in a particular direction, whereas Q-wires in the orthogonal [110] orientation will polarise light in the orthogonal direction. Thus, an equal number of Qwires in both directions will give no net polarisation. In the current examples, however, anisotropy in the SF density is related to the substrate off cut, which beneficially gives rise to a net polarisation.

Thus, in another general set of examples, Qwires may be formed from In-rich regions, for example In-rich regions caused by the intersection of Qwells with stacking faults.

Example Structure: LED

Figure 3:
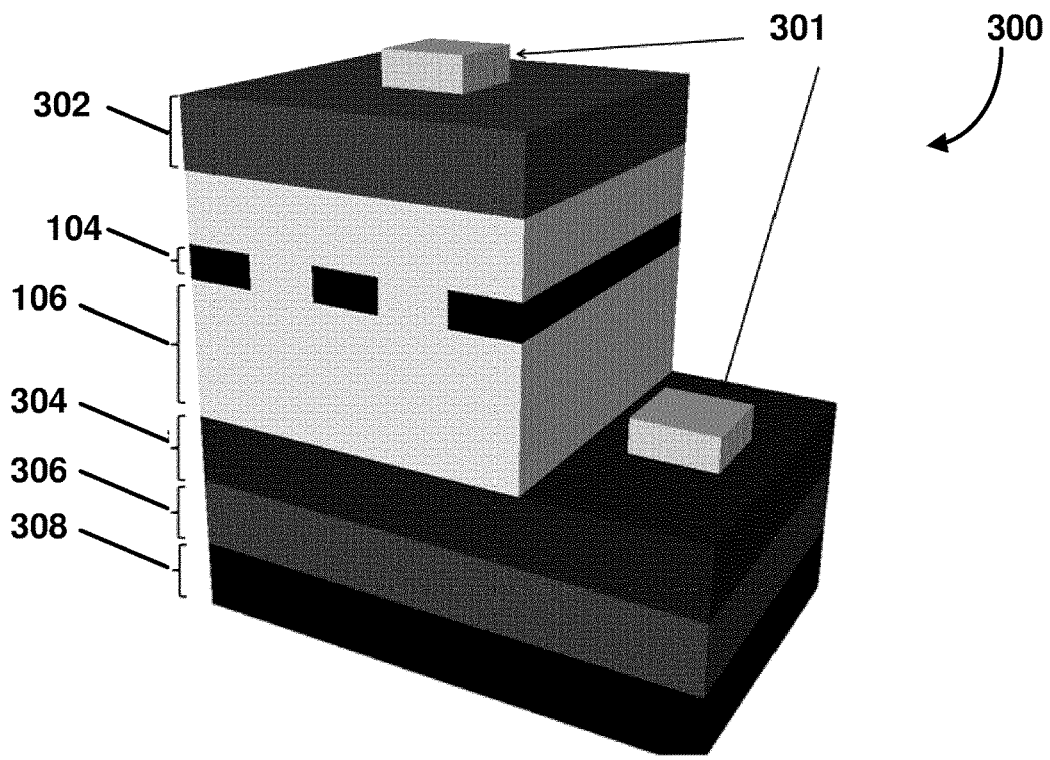
FIG. 3 illustrates a model light emitting diode (LED) structure comprising quantum wires of GaN and InGaN as illustrated in FIG. 1.

FIG. 3 shows a model of a light emitting diode (LED) device 300 in which low-bandgap strands 104 sandwiched between high-bandgap materials 106 (such as InGaN/GaN) forming quantum wires 104 to make up an active region capable of emitting polarised light. Electrical contacts 301 are placed over a p-type semiconductor 302, such as p-type GaN, and an n-type semiconductor 304, such as n-type GaN. Merely for example, p-type GaN may be produced by doping with Mg, where the amount of p-type dopant may be, for example, in the range of $10^{17}$ to $10^{20}$ cm$^{-3}$. The n-type may be doped with Si, or Geranium (Ge), in amounts of around $10^{18}$ to $10^{20}$ cm$^{-3}$. Zb-GaN (That is, cubic GaN) 106 makes up the bulk of the active region with transverse inclusion of InGaN 104. The LED structure 300 is disposed on a suitable substrate, for example silicon carbide 306 such as 3C—SiC (which is the only cubic polytype of SiC) pure Si 308, or GaAs. Thus, the cubic GaN crystals may be grown directly on the cubic SiC substrate.

LED structures as described in the present examples which comprise Qwires and/or Qwells in the optically active region possess other advantages beyond just providing polarised emission or temperature-independent polarised emission. Emission may not only be polarised, but may be spectrally broad as well. Moreover, this broad emission can be tuned across the visible spectrum by changing the Qwell width. This is advantageous, for example, for use in White LED backlighting, where a broad spectrum enables a wide colour gamut (i.e. for a whiter white).

Example Structure: Laser Diode

Figure 4:
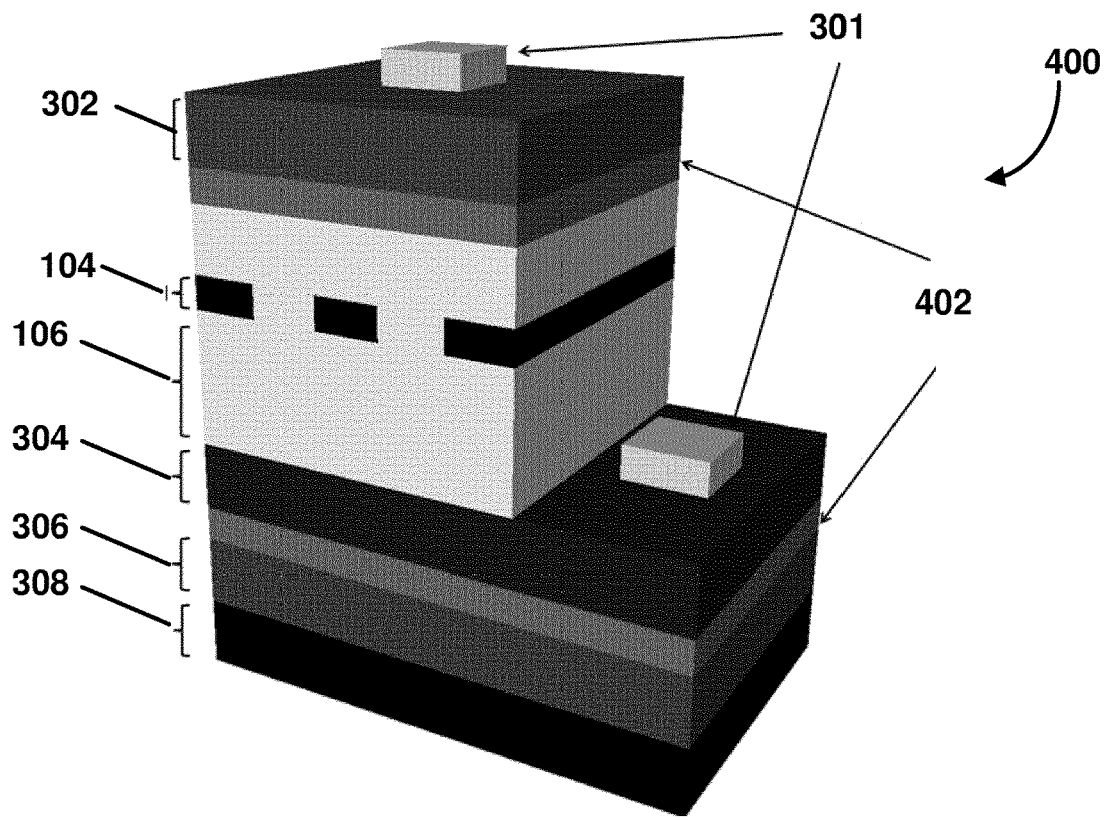
FIG. 4 illustrates a laser diode structure comprising quantum wires of GaN and InGaN as illustrated in FIG. 1.

FIG. 4 shows a model of a laser diode device 400, again with the quantum wires making up the active light-emitting active region, which again is made of low-bandgap strands 104 sandwiched between high-bandgap materials 106 (such as InGaN/GaN). Electrical contacts 301 are again placed on p-type semiconductor 302 and an n-type semiconductor 304 respectively. The active region 104, 106, which may comprise zb-GaN/InGaN, is sandwiched between reflective layers 402, which provide for the laser functionality. Again, the diode structure is disposed or deposited on a suitable substrate, for example silicon carbide 306 such as 3C—SiC (the cubic polytype of SiC) and pure Si 308.

Qwires Formed from Qwell Width-Fluctuations

Figure 5A:
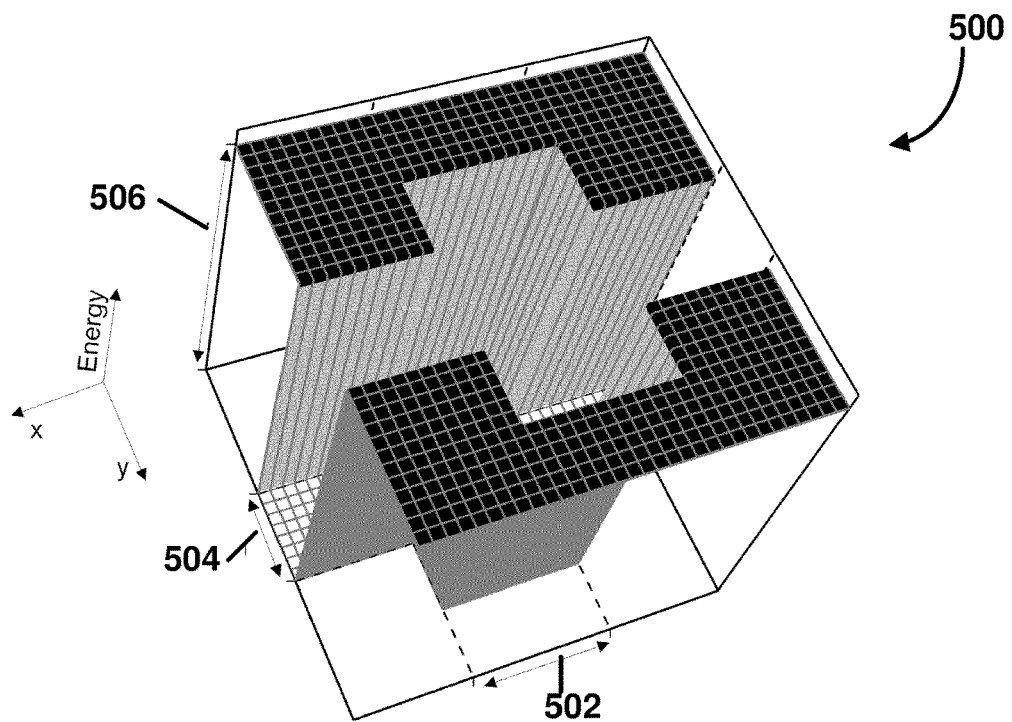
FIG. 5a shows a schematic energy potential diagram for a quantum well with a width fluctuation forming a quantum wire.

FIG. 5a shows the 2-dimensional confinement potential 500 caused by a local increase in the Qwell width, such as those created by the Qwell width distortions/fluctuations as seen in the Qwell channels 104 in FIG. 2. These distortions in width create a Qwire in the z direction (corresponding to the [1-10] crystal direction in FIG. 2), and therefore polarised emission. In this example, the Qwell has a potential energy depth 506 of 80 meV, the Qwell has general width 504 of 4 nm (y-direction), and the fluctuation in width is 6 nm in the x-direction 502, and 10 nm in the y-direction.

In order to solve for the potentials in this example, the time independent Schrodinger equation (TISE) was solved in 1 dimension to find the heavy-hole and electron ground state energies, for Qwells of different thicknesses. These Qwells were then treated as Qwell width distortions of infinite extent. By comparing the ground state energies in these different Qwells, an estimate of the energy difference between ground states inside and outside of a well width fluctuation was obtained as a measure of how well the carrier is confined within the fluctuation.

TISE calculations for the hole potential result in ground state energy differences up to around 6 meV, indicating that the hole is not well confined to width-fluctuation Qwires. The holes are not significantly impacted by width fluctuations, due to the holes having a large effective mass. On the contrary, however, holes are more likely to be localised to Indium-rich fluctuations, which are not accounted for in this calculation.

The electron ground state energy difference can be as high as 100 meV for a change from a 4 nm to a 12 nm Qwell. Thus, advantageously, electrons may be confined by width-fluctuation structures, and as such the energy difference as high as 100 meV can significantly reduce the rate of thermionic emission out of the Qwire at room temperature. Therefore, further advantageously, such a width-fluctuation structure in cubic InGaN/GaN Qwire structures may exhibit an intensity of emission which is independent of temperature (i.e. may function well at room temperature).

However, a change in well width below 2 and 3 nm, depending on the initial well width, merely results in an energy difference comparable to that of the holes (around only 6 meV). Therefore, these electrons will not be well confined. Thus, in the case where the fluctuation in well width is below ~3 nm, the rate of thermionic emission will be high at room temperature. Thus, at higher temperatures approaching room temperature, the intensity of the emission may drop to around 10% of its value at low (~10 K) temperature. Therefore, these modelling results suggest that a rougher Qwell may result in a stronger confinement of carriers, in particular electrons. Therefore, rough Qwells may give rise to photoluminescence (PL) having an intensity that is more temperature-independent than in smoother Qwells.

In summary, well width changes/fluctuations above around 3 nm are required to reduce thermionic emission of electrons out of the Qwires, such that temperature-independent emission intensity may be obtained. However, Qwell distortions will only confine an electron if their spatial extent along the Qwell is comparable to or larger than the electron Bohr radius, around 2.5 nm.

Figure 5B:
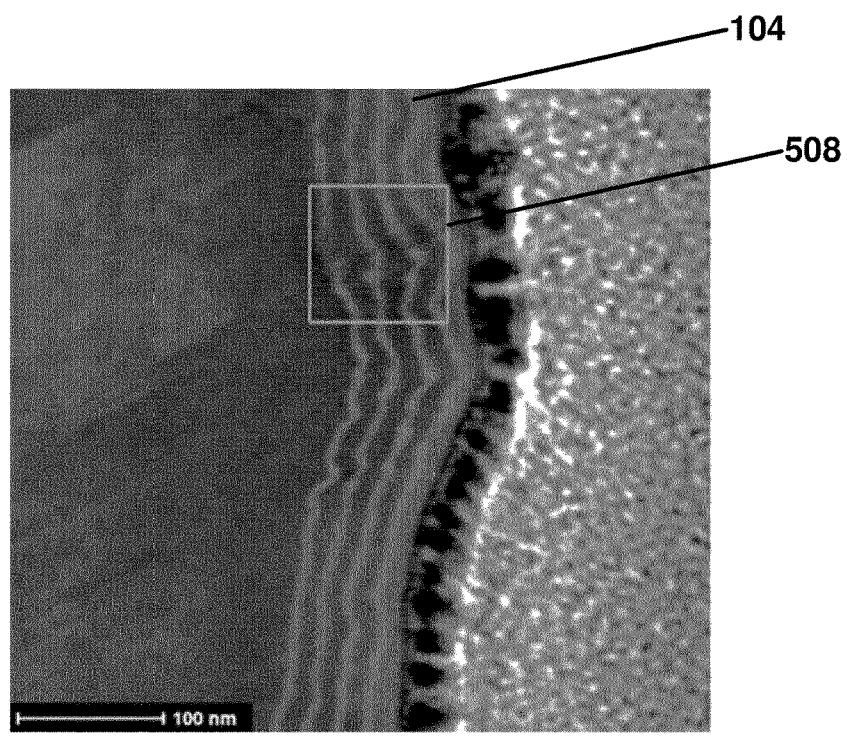
FIG. 5b shows a transmission electron microscope image of a zincblende InGaN/GaN quantum well sample with 8 nm wells, showing width-fluctuations in the wells.

FIG. 5b indeed shows a TEM image of a zincblende (cubic) InGaN/GaN 104 quantum well 100 sample (with Qwell widths of 8 nm on average), comprising width-fluctuations 508 in the wells. The image shows large distortions/fluctuations to the Qwell. In the present case, this is caused by an underlying roughness of the crystal. The underlying crystal roughness may thus be intentionally fabricated (i.e. by altering annealing and growth conditions in a MOVPE growth process), which may exploit the anisotropic diffusion of Ga and N atoms which are inherent to the crystal at certain temperatures.

In this example in FIG. 5b, the average Qwell width is 8 nm, however, this can vary between about 4 nm to 12 nm. These distortions in Qwell width only occur in one dimension and, surprisingly, may result in additional carrier confinement. This would result in quantum wire (Qwire)-like structures going into the figure, i.e. the [1-10] direction as illustrated in the legend). Again, advantageously, recombination of electrons and holes from ground states in such Qwires resulting from width-fluctuations results in polarised emission, wherein the plane of linear polarisation is in the direction along the length of the wire.

Qwires Formed from Indium-Rich Regions

It will be understood by the skilled person that, although Indium is the example used in the following examples as the alloying material which gives rise to the formation of Qwires and therefore polarised emission in (e.g., zb-GaN/InGaN) semiconductor structures, various other suitable materials, elements, or crystals may be used. Generally, any suitable zincblende group III-nitride with an appropriate structure may be suitable to give rise to Qwires exhibiting polarised emission.

For example: Boron rich GaN, Ga rich AlGaN, and generally any of aluminium nitride (AlN), gallium aluminium nitride (GaAlN), aluminium indium gallium nitride (AlInGaN), Indium Aluminium Nitride (InAlN) or GaN enriched/alloyed with a suitable Group III element, or combination of elements, provided that said enrichment/depletion/alloying results in a narrower band gap material than the surrounding matrix material to induce carrier confinement. That is, carriers are confined in 2 dimensions such that they are free to move only in 1 dimension. A general formula for the matrix and embedded region material is thus: (Al)(Ga)(In)(B)N, where the embedded region which defines or comprises the Qwire may contain the same elements in different proportions, or may be alloyed with additional materials, to produce a material with lower band gap.

Figure 6:
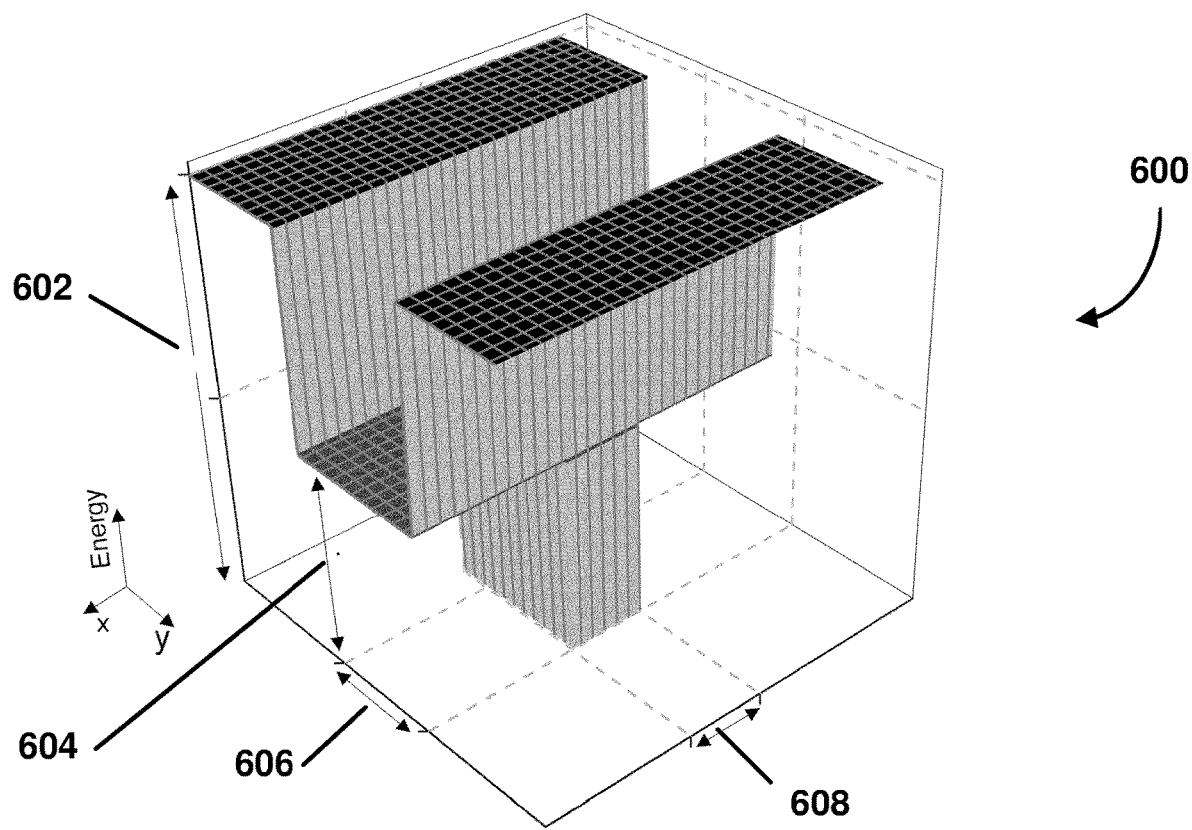
FIG. 6 shows a schematic energy potential of the conduction band of a quantum wire resulting from an Indium-rich region around the interaction of a stacking fault with a quantum well.

FIG. 6 shows a schematic energy potential 600 of the conduction band of a quantum wire resulting from an Indium-rich region around the interaction of a stacking fault with a quantum well. The theoretical dimensions of the Qwire resulting from the indium-rich region is 6 nm in the y-direction 606 by 4 nm in the x-direction 608. The potential of the Quantum well-depth 604 is 70 meV, and the total potential depth of the system 602 is 150 meV. In the theoretical modelling of this Qwire, the band alignment between the stacking fault and the stacking fault-free zb-GaN has been ignored, as the spatial extent of the high indium content region is larger than the stacking fault itself.

Figure 7:
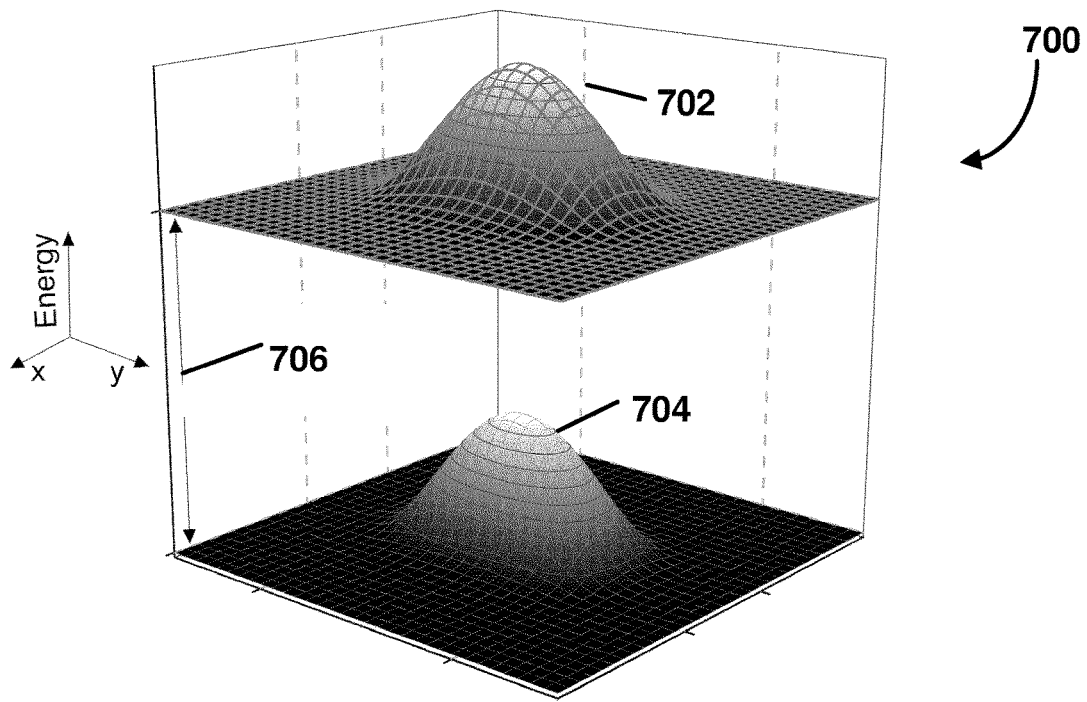
FIG. 7 shows electron and hole wavefunction solutions solved for a model energy potential for a 8 nm quantum well having a 4 nm wide In-rich region.

FIG. 7 shows a graph 700 illustrating the electron 702 and hole 704 wavefunction solutions, offset 706 by the energies of the states, solved for a model energy potential of a 8 nm Qwell having a 4 nm wide In-rich region. This generally corresponding to the model potential 600 in FIG. 6.

Figure 8:
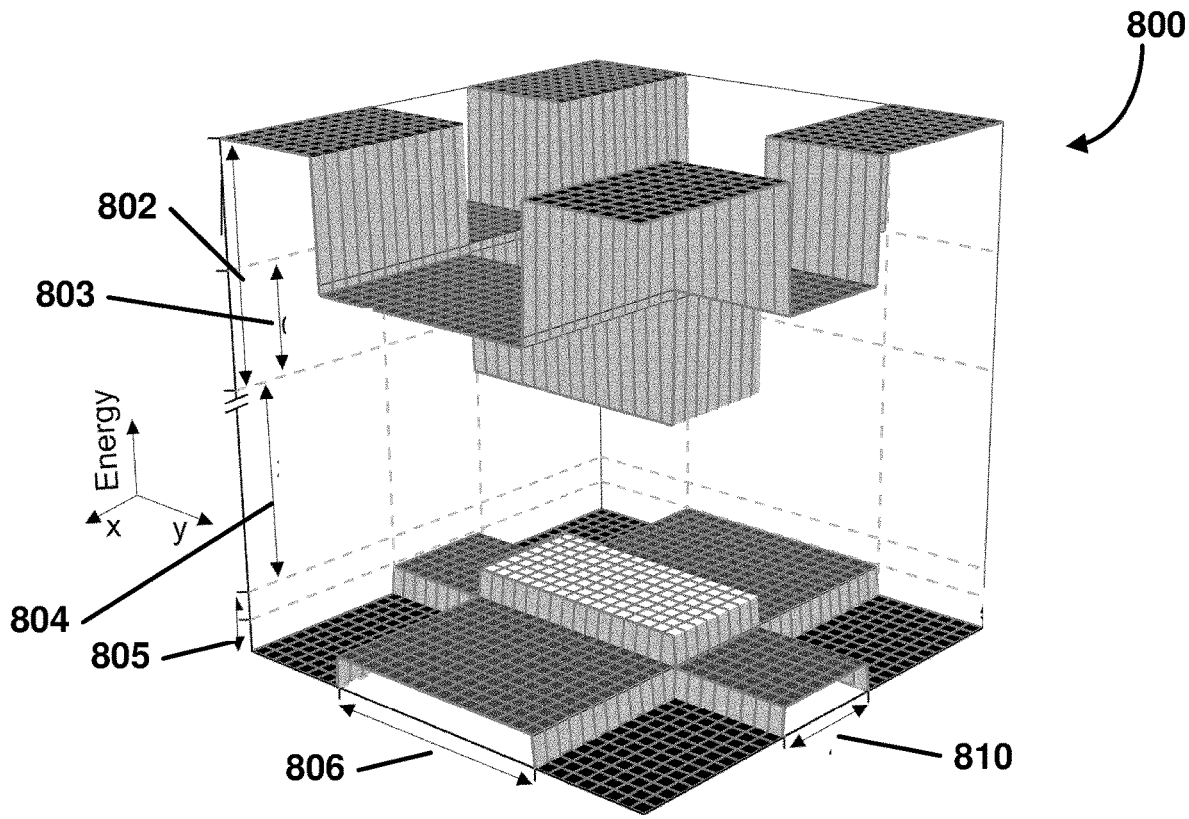
FIG. 8 shows a simplified full energy potential of a conduction and valence band for a 8 nm quantum well having a 4 nm wide Indium-rich region, corresponding to the wavefunctions in FIG. 7.

FIG. 8 shows a simplified full energy potential 800 of a conduction and valence band for a 8 nm quantum well having a 4 nm wide Indium-rich region, corresponding to the wavefunctions in FIG. 7. The potential shows: the full depth 802 of the conduction band from the base of the Qwire to the stacking-fault free Qwell (0.52 eV); the energy difference 803 of a carrier confined to the Qwire conduction band and the Qwell (0.28 eV); the bandgap 804 between the potential depth of the Qwire conduction and valence band (2.57 eV); the potential depth of the valence band of the Qwire 805 (0.15 eV), and the respective x dimensions 810 and y dimensions 806 of the Qwire (4 nm by 8 nm, respectively).

Again, as seen in FIG. 2, the intersection of SFs with the InGaN Qwells produces regions with up to double the fraction of In. Thus, generally, the indium fraction in the Qwire may be around double the value in the Qwell overall. To calculate how electrons and holes are influenced when a SF causes a local increase in the indium fraction by a factor of 2, the potential shown in FIG. 6 was studied. The potential was assumed to be constant in the z-direction and the impact of alloy fluctuations was not considered.

The problem was simplified to the potential shown in FIG. 8 to allow the separation of variables. This assumption will be valid so long as the carriers are well confined by the Qwire. The time-independent Schrödinger equation (TISE) was then solved separately for each dimension, including the effect of the Coulomb interaction between electrons and holes, extracting the carrier wavefunctions, as shown in FIG. 7, and the ground state energies. This model was used to investigate the temperature dependence of intensity and polarisation of the Qwire PL emission.

Temperature Dependence of the Intensity

The wavefunction 700 and energies 600 of the electrons and holes were calculated whilst varying the dimensions of the system. That is, the Qwell width and the Qwire width were varied, as well as the indium fraction content in the Qwell. In each case, the ground state energies were compared with the overall depth 602 of the Qwire (i.e. the energy difference between the Qwire base and the stacking fault-free Qwell) to determine whether carriers are confined by the Qwire at a temperature of 10K and to provide a qualitative assessment of the degree of carrier confinement at room temperature.

Thus, the model allows the rate of thermionic emission to be compared for different Qwire dimensions and indium fractions. Models used for thermionic emission out of Qwells may show that the rate of thermionic emission is proportional to $\exp(-\Delta E/kT)$, where T is the temperature, k is Boltzmann's constant, and $\Delta E$ is the difference in energy between the confined carrier and the barrier height.

Applied to the Qwires, $\Delta E$ is the energy difference 604 between a carrier confined to the Qwire and the Qwell (i.e., 70 meV as seen in by the depth of the Qwire 604 in FIG. 6). Thus, and in view of the Boltzmann distribution above, if the rate of thermionic emission is high compared with other mechanisms, the intensity of the Qwire-related emission may be reduced upon temperature increase. Therefore, in a preferable example, a large energy difference will exist between the confined Qwire carrier and the Qwell; this will result in a slower rate of thermionic emission, which will in turn result in an advantageously temperature-independent (polarised) emission intensity. Generally, thermionic emission is used to refer to charge-carrier escape from the Qwire, which will unfavourably result in reduced intensity of (polarised) emission. Thermal excitation is used to refer to the thermally induced occupation to an excited state.

For Qwells with the lowest indium content (4%, corresponding to a local increase of around 8% in the Qwire itself), the charge carriers are confined at 10 K for all dimensions except the smallest Qwire studied (2 nm by 1 nm). However, the hole ground states are only up to tens of meV (i.e. around 10-50 meV) below the QW energy and therefore the rate of thermionic emission may be unfavourably high.

Nevertheless, advantageously, the effect of high rates of thermionic emission can be mitigated by increasing the indium content of the Qwell. For a 20% indium Qwell (corresponding to a ~40% indium fraction in the Qwire), the carrier ground state energies are up to hundreds (i.e. around 100-500 meV) of meV below the Qwell energy. Therefore, the rate of thermionic emission will be significantly reduced, and such Qwires may obtain favourable levels of temperature-independent intensity of emission (which may be PL emission, or electro-luminescent emission, for example). A narrow Qwell might still be suitable: experimental PL measurements on a 2 nm (i.e. as discussed later in FIG. 12) show how the emission may only be reduced to around 40% at room temperature. This may be because the other dimension of the Qwire is wide, as the TEM/EDX study indicates that the regions of high indium content are typically between 4 nm and 8 nm wide.

Generally, as the overall dimensions of the Qwire are increased, the ground state energies decrease, which further reduces the rate of thermionic emission. However, the dominant cause of mitigating unfavourable thermionic emission between states is in increased indium content. Thus, in summary, to minimise the impact of thermionic emission, a higher indium content and wider Qwell is beneficial and advantageous.

Temperature Dependence of Polarisation

It is known that emission from Qwires, at very low temperatures (<10 K) is optically polarised along the length of the wire. This optical polarisation may be a result of light-hole heavy-hole mixing due to anisotropy along the wire and perpendicular to the wire, caused by the confinement potential. This results in a variety of different confined hole sub-bands, each with a different fraction of light hole character. Additionally, transitions involving the hole ground state (which is energetically similar to the pure heavy-hole ground state) and the $1^{st}$ hole excited state are polarised along the length of the Qwire.

However, the $2^{nd}$ hole excited state, and all further excited states, are polarised perpendicular to the Qwire. This $2^{nd}$ hole excited state lies approximately midway between the heavy-hole ground state and the light-hole ground state. As the temperature is increased, holes will be thermally excited into the excited states and will recombine in transitions that are orthogonally polarised, reducing the net polarisation observed from emission of the Qwire. This temperature dependent polarisation is therefore a general property of Qwires. Moreover, the dimensions of the Qwire have been seen to determine the strength of the dependence on the temperature.

Advantageously, however, it is also observed that for narrower Qwires, the temperature dependence is reduced, or even entirely removed. This observation can be explained by considering the energy differences between states in the Qwire. If the energy difference between the ground state and the excited orthogonally polarised state is large, the thermal occupation of the excited state may be reasonably small, and thus the polarisation will not reduce much with increasing temperature. Additionally, if there are no excited states in the Qwire, further advantageously, the degree of polarisation will be substantially temperature independent.

In order to determine what properties of the Qwires are required to achieve temperature independent polarisation, the previous model (used to model intensity dependence on temperature) was extended to include the impact of light holes. The effective mass for these holes is approximately 100 times less than that of the heavy hole. Using the same method as before, the ground state energies for the light-holes were calculated for different indium contents and Qwire dimensions. The approximate energy for the 2nd excited hole state was then estimated as the midway value between the heavy-hole and light-hole ground state energies.

Figure 9:
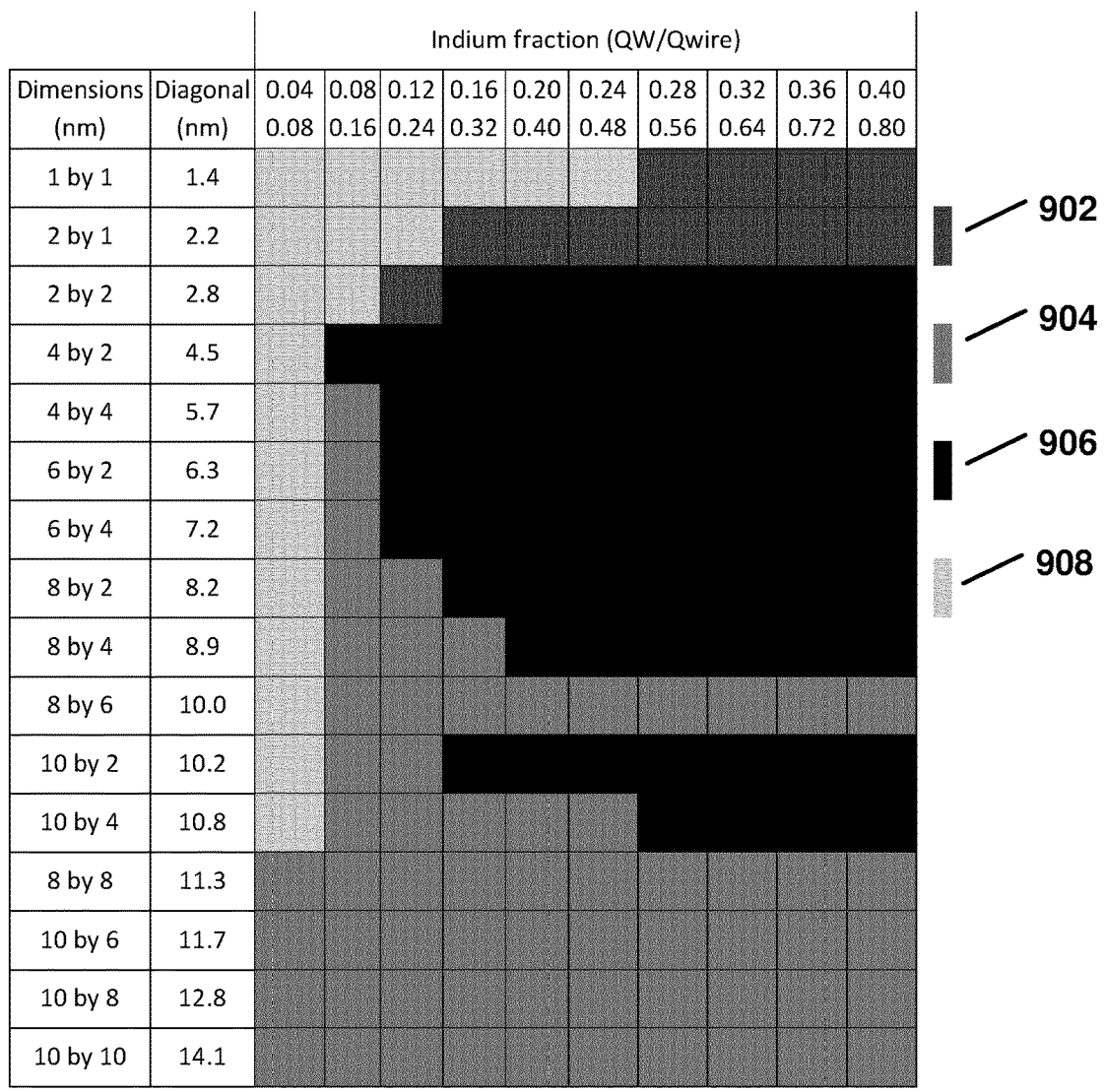
FIG. 9 shows tabulated results of electronic properties of a set of quantum wires having varying dimensions and Indium fraction.

These results provide a guide towards the ideal dimensions and indium contents to obtain Qwires with polarised emission that is temperature independent:

FIG. 9 shows table 900 summarising these results, where the dimensions and relative indium fractions in Qwires are shown, indicating which combinations may lead to polarised emission that is temperature independent. In the table, the legend is as follows: No $2^{nd}$ excited state (902); Small excited state splitting (904); large excited state splitting (906); and Significant thermionic emission (908).

For example, Indium fractions of 0.04 would result in there either being no excited confined state, or the excited state is very close the Qwire depth. Therefore, the emission from these Qwires would exhibit a high degree of polarisation up to room temperature. However, as mentioned previously, the hole ground states are close to the Qwire barrier energy, and therefore the rate of thermionic emission will be high (908). This fact is reflected in FIG. 9, using kT at room temperature (26 meV) as a rough guide to the rate of thermionic emission.

Similarly, for narrow Qwires with dimensions of 2 nm by 2 nm and below, there is no confined excited state (902) and therefore the polarisation will be temperature independent. However, if the indium content is too low, the hole ground state will be close to the Qwire barrier height and therefore the rate of thermionic emission will be high (908). To avoid this, indium contents above 0.16 are required for narrow Qwires to result in polarisation and intensities that are temperature independent (i.e. 902, or 906).

For Qwires with larger dimensions and lower indium compositions, the excited hole states are confined and therefore can be thermally populated at room temperature (i.e. generally 904 and 908). However, for larger indium contents, the energy separation between the ground state and the excited state is large, up to around 60 meV, and therefore this thermal population will be small. The energy separation increases due to the reduced penetration of the hole wavefunction into the barrier, which results in a polarisation which will not vary much with temperature up to room temperature.

Examples of the previously discussed structures can all be effective at producing Qwires and therefore result in optically polarised emission. Furthermore, the results in FIG. 9 illustrate that certain examples having sufficiently high Indium contents (in some examples above about 20%) and Qwires of the right dimensions (for example cross-sectional diagonal lengths between about 2 and 8 nm) may have substantially temperature-independent emission intensity and emission degree of polarisation.

However, the above structures may be the result of structural defects, which may be more difficult to control. Therefore, a technique of fabricating a semiconductor structure, which can be directly controlled, operable to produce polarised emission would be even further advantageous.

Figure 10:
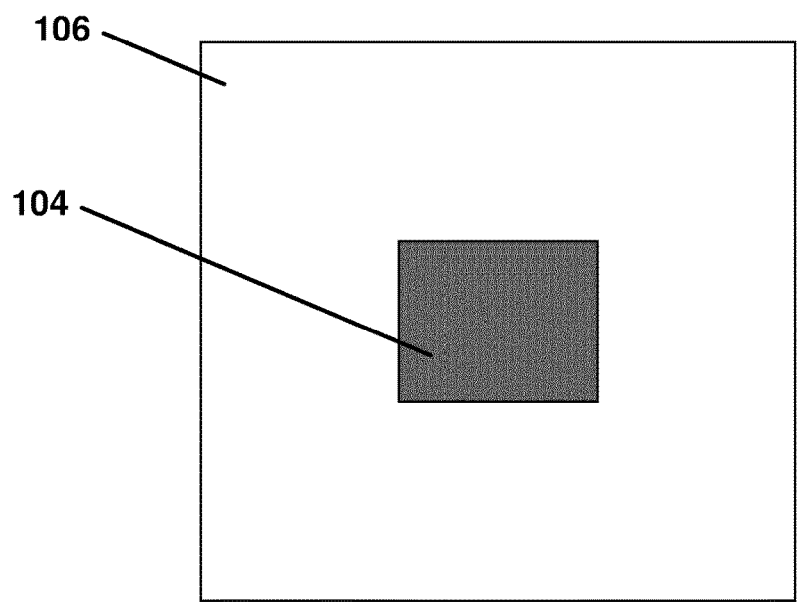
FIG. 10 is a schematic of a quantum wire produced by etching a quantum well.

FIG. 10 shows an example structure that achieves this additional controllability. FIG. 10 shows schematic of a quantum wire 104 comprising a doped cubic GaN crystal (such as InGaN) surrounded by a region cubic GaN 106. The dimension of these structures can be controlled by varying the thickness of the Qwell, and subsequently etching portions away. That is, InGaN/GaN Qwells can be grown and subsequently etched away, in order to produce InGaN/GaN Qwires. These Qwires may combine both confinement effects studied previously: that is, there is an increased indium content within the Qwires 104; and, the thickness of the Qwells may vary.

To determine the polarisation emission properties of these structures at room temperature, a similar analysis was performed as in the above description. The TISE was solved in two dimensions for electrons and holes in a separable potential, having a similar form to that shown in FIGS. 7 and 8. This was done for a range of indium compositions/fractions between 0.05 and 0.30, with Qwell widths between 2 and 10 nm, and etch-separations between 5 and 20 nm. The ground state energies for electrons and holes confined to the Qwires were calculated in each case.

Figure 11:
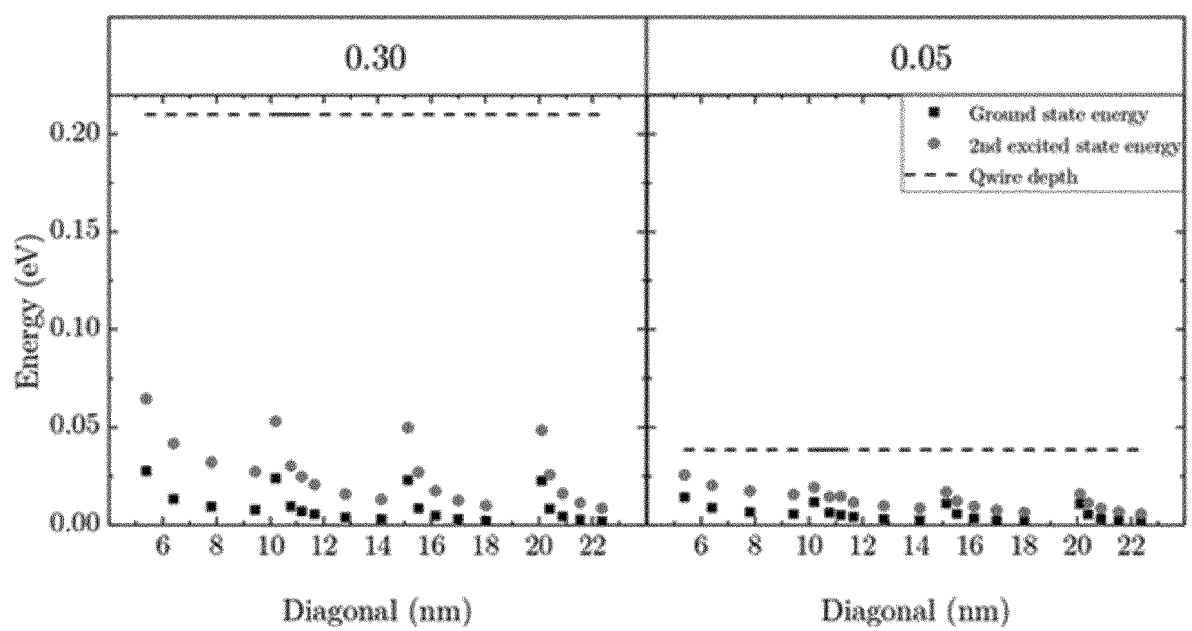
FIG. 11 shows a graph of calculated hole ground state energies (squares) and 2nd excited hole state energies (circles) for rectangular quantum wires created by etching an InGaN/GaN quantum well with different cross sectional sizes, as defined by the diagonal lengths, and indium content.

FIG. 11 shows the hole ground state energy and the energy of the orthogonally polarised excited state for 0.05 and 0.30 fractions of indium. As with the SF-induced Qwires, it is the hole energies which predominantly determine the luminescence behaviour of the system (rather than the electron energies). FIG. 11 shows calculated energies for the ground and excited states for holes. These results show that the calculated states are well confined to the Qwires for all dimensions and indium contents investigated. Therefore, when considering how the polarisation of the emission is dependent on temperature, it is therefore beneficial to consider the energy splitting of the ground and excited state.

The hole energy levels are compared with the depth of the Qwire. For all combinations of Qwire dimensions and indium content, the carriers are confined to the Qwire at low temperature. The calculations show that the hole ground state is a minimum 24 meV below the Qwire barrier height, which is for a 0.05 indium Qwire of dimensions of 2 nm by 5 nm. As the dimensions of the Qwire increases, the confinement energy of the holes reduces, which also results in a reduced rate of thermal excitation. The results of FIG. 11 also show that increasing indium content reduces the rate of thermal excitation. As mentioned above, advantageously, reductions of thermal excitation results in greater temperature-independence of the degree of polarisation. In this case, because the orientation of hole ground state and excited states are orthogonally polarised, a reduction in the rate of thermal excitation between the two reduces the temperature-dependence of the degree of polarisation of the emission. Generally, thermal excitation is used to refer to the thermally induced occupation to an excited state, and thermionic emission is used to refer to charge-carrier escape from the Qwire.

Compared with the SF-mediated Qwires, the hole energies are, on the whole, further below the Qwire barrier height. This indicates that the rate of thermionic emission is lower in InGaN/GaN Qwires generated by this method such as illustrated in FIG. 10. Thus, advantageously, the intensity of the recombination may be more insensitive to temperature changes, resulting in a temperature-independent polarised emission source.

In more detail, the energy splitting of the states depends upon the size and indium content of the Qwires. For an indium content of 0.05, the energy splitting increases from 4 to 11 meV as the dimensions of the Qwire are reduced. Thus, a smaller Qwire would advantageously reduce the thermal occupation of the excited state, which would consequently reduce the impact of the temperature upon the optical polarisation. However, these energies splitting are relatively small compared with kT at room temperature (26 meV), which suggests that the optical polarisation of the emission will depend strongly upon the temperature for low indium contents. Generally, increasing the indium content is seen to increase the energy splitting, e.g. up to 36 meV splitting for a 2 nm by 5 nm Qwire with an indium content of 0.30.

Moreover, increasing the indium content may also amplify the beneficial effects of changing the dimensions of the Qwire. These effects occur because an increased indium content reduces the penetration of the carrier wavefunctions into the barrier. The results therefore suggest that a higher indium content will advantageously reduce the impact of temperature on the polarisation of the emission. In detail, the energy splitting becomes larger than kT at room temperature for indium contents of 20% and above for a 2 by 5 nm Qwire, and above 0.25 for a 4 by 5 nm Qwire.

In summary, to achieve beneficially temperature-independent optical polarisation in cubic InGaN/GaN, or more generally cubic group-III Nitrides alloyed with a bandgap-reducing alloy material, narrower Qwires are desired with the greater indium content.

Figure 12:
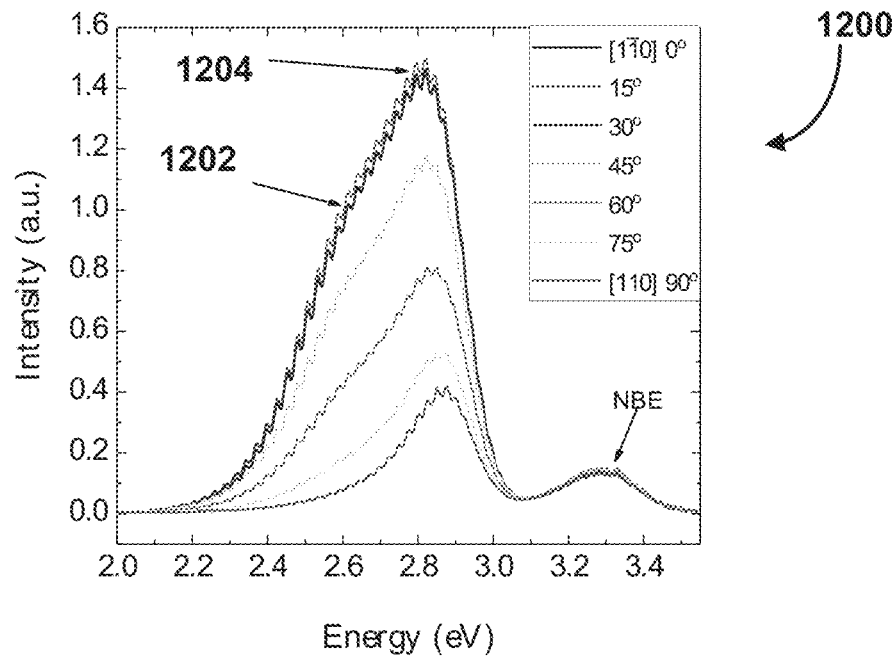
FIG. 12 shows a graph of an experimental photoluminescence spectrum taken at 10 Kelvin of a cubic GaN with InGaN sample having 5 quantum wells, each with a thickness of 2 nm.
Figure 13A:
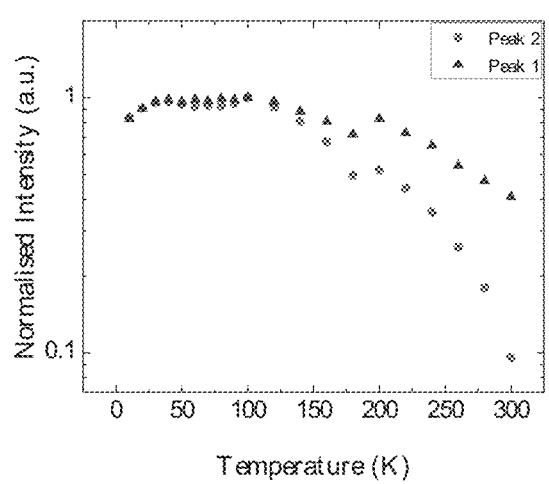
FIGS. 13a and 13b show the temperature dependence of the normalized intensity and the degree of polarisation, respectively, corresponding to peaks shows in FIG. 12.
Figure 13B:
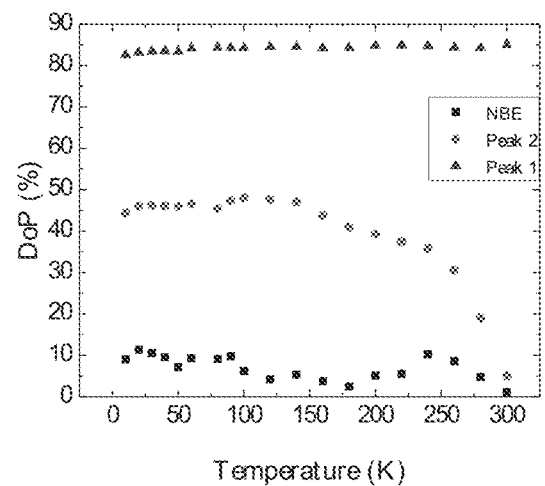

FIG. 12 shows a graph 1200 of an experimental photoluminescence spectrum taken at 10 Kelvin of a cubic GaN with InGaN having five quantum wells, each with a thickness of 2 nm. In detail, the polarized PL spectrum, taken at 10 K shows two peaks 1202, 1204 which are attributed to Qwell/Qwire luminescence, which are both polarised in the [1-10] direction (corresponding to the [1-10] direction of Qwire illustrated in FIG. 2). The near band edge emission is unpolarised, indicating that the polarization is a property of the Qwell/Qwire luminescence and not an external effect. Similar results may also be obtained for Qwells with thicknesses of 4 nm, 6 nm and 8 nm FIG. 13*a* shows the temperature dependence of the normalized intensity corresponding to peaks 1202 and 1204. FIG. 13*b* shows the variation of the degree of linear polarization with temperature for each of the peaks in FIG. 12 and the near band emission (NBE)

The PL results of the 2 nm Qwire, shown in FIGS. 13*a* and 13*b* show that the polarisation of peak 1202 is independent of temperature, and further the intensity of peak 1202 does not change much with temperature. One of the dimensions of the Qwire is defined by the Qwell width, which is 2 nm, where the other is not known for the results shown here.

The modelling shows that, for Qwires with any of the dimensions studied, it is possible that the Qwire will result in recombination with the properties observed in FIG. 13, which is more likely with increasing indium fraction in the Qwell. In contrast, the intensity of peak 1204 drops significantly with temperature, and the polarisation becomes close to zero at 300K. The result of peak 1204 is thus less compatible with the model of Qwires produced by a local increase in indium concentration (i.e. intersection of SF with Qwell), as a strong temperature dependence in the intensity should cause the polarisation to be independent of temperature. Therefore, peak 1204 is unlikely caused by such In-rich Qwires.

In summary of the above description, PL measurements show that the emission from zb-InGaN/GaN QWs is highly polarised at 10 K (up to 80%) in the [1-10] direction, perpendicular to the substrate roughness/miscut. There are also two separate emission peaks attributed to emission from the QWs. Peak 1202 is at a lower energy and is broader than peak 1204. As the temperature is increased from 10 K to 300 K, the polarisation of peak 1202 remains constant at 80% and the intensity drops to around 40% of the low temperature value. Over the same temperature range, the polarisation of peak 1204 drops from 45% to approximately zero, and the intensity falls to 10% of its low temperature value.

TEM/EDX measurements reveal the presence of SFs which intersect with the QWs. In the region of the QW around this intersection, the indium content can increase up to double of the indium content generally in the InGaN Qwell region. This results in the presence of high indium content Qwires, which may confine charge carriers in 1 dimension, and thus emit polarised light.

For low indium contents and small Qwire dimensions, the emission intensity drops dramatically with temperature, because hole carriers are much more likely to leave the Qwire via thermionic emission.

For high indium contents and large Qwire dimensions, excited confined states exist within the Qwire that emit light polarised perpendicularly to the ground state: as the temperature is increased, these excited states will be populated and the polarisation will reduce. The behaviour of peak 1204 is therefore incompatible with this modelling as the intensity and polarisation drop with increasing temperature. However, FIG. 9 shows that there are various combinations of Qwire dimensions and indium contents which may advantageously result in temperature-independent intensity and polarisation emissions, corresponding to peak 1202 in FIGS. 13*a* and 13*b*. The lower peak energy of peak 1202 could also be explained by the relatively high indium content of the Qwires. The emission spectrum may be broad due to the contribution of variation between different SF-intersections. Therefore, evidence of FIGS. 12 and 13 suggests peak 1202 may be a result of indium-rich Qwires.

TEM measurements also reveal that the QW structures are distorted in one dimension due to the roughness of the underlying crystal, which may cause changes in the well width as seen in the image of FIG. 5*b*. This results in Qwire like structures (and thus carrier confinement and polarised emission) in the [1-10] direction. Modelling shows that these structures would not confine holes. Nevertheless, holes may instead be localised by fluctuations (increases) in the relative indium content.

Advantageously for semiconductor device operation, electrons may likely be confined up to 300 K if the changes/fluctuations in Qwell thickness are above around 3 nm in size. Electrons may also be well-confined even up to an operating temperature of about 400 K, where temperature-independent degree-of polarisation is achieved with certain combinations of Qwire dimension and alloying material content, e.g. as various configurations in FIG. 9. Therefore, for rougher QWs, the emission intensity depends less upon temperature, due to a reduced thermionic emission. It is possible that these structures are attributable for peak 1204 in the PL spectra.

Qwells comprising InGaN/GaN may be etched in order to produce Qwires in a more controllable manner. The calculations suggest that emission that has an intensity and optical polarisation independent of temperature is achievable in such a structure, as illustrated in FIG. 10, for narrow Qwires produced from Qwells having dimensions of around 4 nm, and having with indium fractions above around 0.20.

Although the aforementioned description is directed to experimental structures, and modelling results, in respect of cubic GaN and InGaN (which may be grown on cubic 3C—SiC), it would be appreciated by the skilled person that different compositions group-III Nitrides forming the Qwell region and surrounding matrix may also be suitable for such semiconductor devices exhibiting polarised emission. For example, aluminium nitride (AlN), gallium aluminium nitride (GaAlN), Boron Gallium Nitride (BgaN), Ga-rich AlGaN, indium gallium nitride (InGaN), aluminium indium gallium nitride (AlInGaN), and similar nitride layers, provided the layer or region defining the Qwell is alloyed to possess a lower band gap than the surrounding (matrix) material.

Composition and Structure of Crystal

The inventors have identified that optically polarised emission can be produced, at room temperature, from cubic InGaN/GaN quantum wells (QWs), with a degree of linear polarisation (DOLP) of up to 75%. This DOLP is similar to those achieved by wz-QWs, however, the advantage of producing polarised emission from cubic InGaN/GaN quantum wells is that such structure can be obtained using standard MOCVD epilayer growth, obviating the need for any further processing steps. The emission can be tuned to cover the visible spectrum with minimal impact upon the efficiency or dynamics of the recombination. The emission is associated with indium-rich quantum wires which form in the QWs due to their intersection with stacking fault (SF) defects. Furthermore, the quantum wires capture carriers from the rest of the QWs. At low temperatures, the emission from the rest of the QWs can be seen.

Furthermore, the Inventors have identified various features of the structure and composition of cubic-Group-III Nitride-based crystals, which can further affect the duration, degree of polarisation, and temperature dependence of the emission from Quantum wells. Photoluminescence normal to the surface of cubic InGaN/GaN quantum wells, emitting in the visible spectrum, can be observed as optically polarised to a degree of 86% at 10 K, and up to a degree of 75% at room temperature. Scanning transmission electron microscopy and energy-dispersive x-ray measurements can further demonstrate that one dimensional nanostructures form due to segregation/enrichment of indium content adjacent to stacking faults. The emission from these nanostructures dominates the room temperature spectrum, and redshifts and broadens as a dimension of the quantum well (QW) increases from 2 nm to 8 nm (where this dimension may be a width). Photoluminescence excitation measurements further indicate that carriers are captured by these nanostructures from the rest of the QWs, and recombine to emit light that is polarised along the length of the nanostructure. At low temperatures, the luminescence from the rest of the quantum wells is observed at a higher emission energy.

Generally speaking, green LEDs are not observed in the state of the art. LEDs based on InGaN/GaN quantum wells (QWs) grown on the c-plane of the wurtzite (wz, also known as hexagonal) crystal structure can have room temperature internal quantum efficiencies (IQEs) up to 90% for emission in the blue spectrum. However, advantageously, by increasing the indium content in the QW, the emission wavelength can be extended into the green. This reduces the IQE, a phenomenon known as the green gap. A possible explanation for this drop in efficiency is that the lower growth temperature required to increase the indium content, increases the density of point defects leading to an increased rate of non-radiative recombination.

Additionally, there is a strong electric field perpendicular to the QWs due to spontaneous and piezoelectric polarisation effects. A relatively larger indium content increases the strain in the QW and results in an increase in the electric field strength. The electric fields act to separate electrons and holes and thereby reduce the rate of radiative recombination for longer wavelength emitters. The IQE of green QWs thus may be improved by lowering the indium content, to reduce the non-radiative recombination rate.

The inventors have identified that the so-called green gap may be overcome by growing QWs on zincblende (zb, also known as cubic) GaN, which has a smaller bandgap than wz-GaN by 200 meV. Additionally, zb-GaN has zero spontaneous and piezoelectric fields in the [001] direction, and therefore the electric field across a QW grown in the [001] plane is zero. However, as zb-GaN is thermodynamically metastable during growth, epilayers may contain stacking faults (SFs), which have been observed to have a density of $1 \times 10^5$ cm$^{-1}$ at the surface. These SFs are a change in the stacking order of atoms such that the crystal structure is comparable to wz-GaN in a thin plane.

The following further disclosure presents structural and photoluminescence measurements of zb-InGaN/GaN QWs, and indicates that presence of SFs, in particular the presence of SFs in particular conditions, can lead to polarised emission at temperatures between 10 K and room temperature.

It will be appreciated that the polarised emission has commercial and industrial use in many applications, in addition to Green LEDs, which as mentioned are generally not known in the art. For example, polarised emission can be beneficial as a backlight for liquid crystal displays.

Experimental Structures and Photoluminescence

Samples were grown on a 3C—SiC/Si [001] substrate, with an offcut of 4° towards the [110] direction. The structural properties of the QWs were studied by scanning transmission electron microscope/energy dispersive X-ray (STEM/EDX) using an FEI Tecnai Osiris operating at 200 kV and equipped with four energy dispersive X-ray spectrometers. High-angle annular darkfield (HAADF) images were taken with the beam direction parallel to the [1-10] zone axis. Samples for STEM analysis were prepared using a focussed ion beam (FIB; FEI Helios NanoLab™) in-situ lift-out method.

These 3C—SiC/Si [001] substrates provide a relatively small lattice mismatch (3.4%) with the GaN, and are available in wafer sizes up to 150 mm. Beneficially, this makes such wafers compatible with Si foundries and provides a straightforward path to commercialisation of devices. A zb-GaN epilayer was grown using metalorganic chemical vapour deposition (MOCVD). Five InGaN/GaN QWs were subsequently grown using a quasi-two-temperature (Q2T) method; the barriers had a nominal thickness of 16 nm, and nominal QW thicknesses of 2 nm, 4 nm, 6 nm and 8 nm were studied. The inventors have identified through secondary ion mass spectroscopy (SIMS) measurements, that GaN epilayers can, in examples, comprise an oxygen impurity concentration of the order of $1 \times 10^{19}$ cm$^{-3}$. Even this small presence of oxygen, as described below, can provide an increase in background electrons, which can partially fill the conduction band (CB) and thus may increase the full-width half-maximum (FWHM) of polarised emission. Nevertheless, oxygen impurity is not inherent to providing or enhancing polarised emission. It will therefore be understood that presence of oxygen is not required for providing or improving aspects of polarised emission, and GaN epilayers grown with zero oxygen impurity can have equally advantageous polarisation properties.

The optical properties were investigated with photoluminescence (PL) and PL-excitation (PLE) spectroscopy using a continuous wave HeCd laser at a wavelength of 325 nm with an excitation power density of 10 W cm$^{-2}$, and a 300 W Xe lamp coupled to a monochromator with an excitation power density of 0.4 mW cm$^{-2}$ at each wavelength, respectively.

The PL was focused onto the slit of a double-grating spectrometer with a spectral resolution of 24 Å. The light was detected using a GaAs photomultiplier tube (PMT) and processed with lock-in amplification techniques. The spectral response of the PMT and spectrometer was measured using a calibrated black-body source, and used to correct the PL spectra. The optical polarisation was analysed with a Glan-Thomson polariser, collecting the emission in the [001] direction. PL time decays were obtained by excitation with a 100 fs frequency-tripled pulsed Ti:Sapphire laser with a wavelength of 267 nm resulting in an injected carrier density of $3 \times 10^{12}$ cm$^{-2}$ per pulse.

Figure 14:
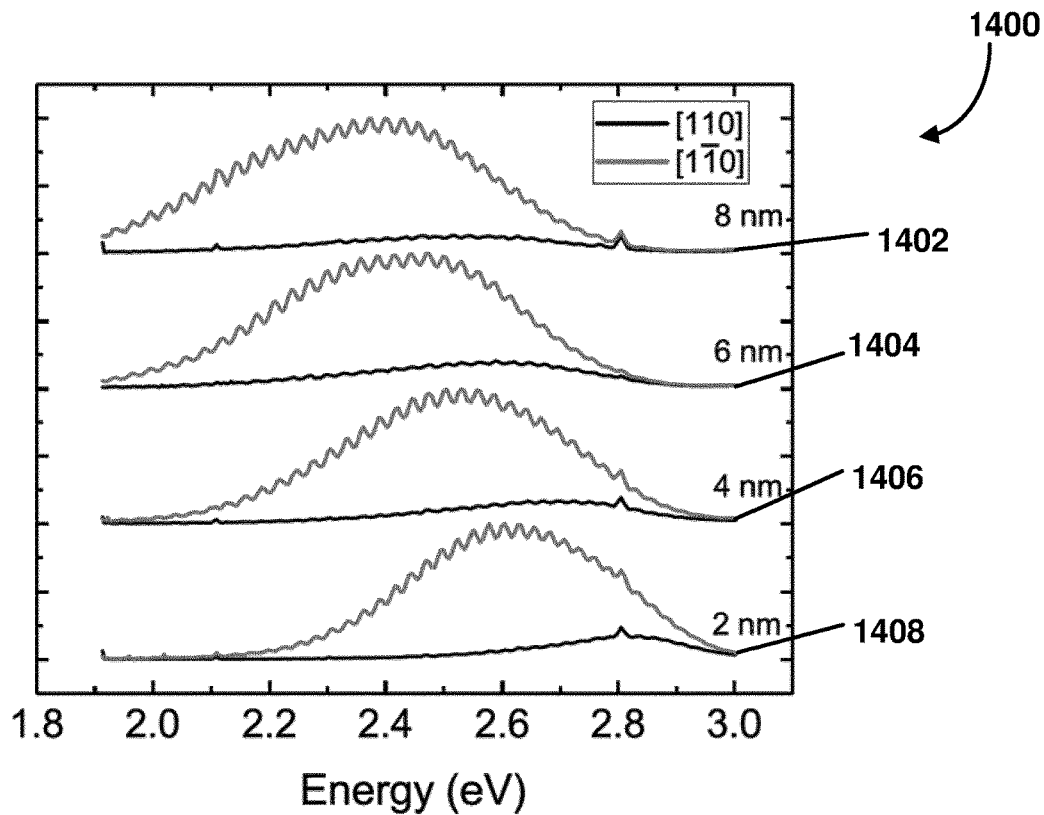
FIG. 14 shows a graph displaying four room temperature photoluminescence spectra for quantum wells of different widths, produced from GaN crystals.

FIG. 14 shows a graph 1400 displaying four polarised photoluminescence spectra, obtained at room temperature, for quantum wells (QWs) with widths of 2 nm 1408, 4 nm 1406, 6 nm 1404 and 8 nm 1402, with polarisation resolved in the [110] (lower lines) and [1-10] (upper lines) directions. These spectra exhibit Fabry-Perot interference fringes that are typically observed in GaN-based multi-layer structures. The peak common to all the spectra at 2.8 eV is a spontaneous emission line from the laser.

Time correlated single photon counting techniques were used to produce PL-decay transients. The polarised PL spectra at room temperature for each sample are shown in FIG. 1. When detecting light polarised in [1-10], a broad emission is observed. In the orthogonal polarisation ([110]), the emission is observed with a reduced intensity. The degree of linear polarisation (DOLP) is defined as DOLP= $(I_{max}-I_{min})/(I_{max}-I_{min})$, where $I_{max}$, $I_{min}$ are the maximum and minimum integrated intensities of the emission. The DOLP was determined, with an error of 5%, to be 75%, 70%, 65% and 75% for QW widths of 2 nm (1408), 4 nm (1406), 6 nm (1404) and 8 nm (1402) respectively, and is therefore broadly independent of the QW-width.

The normalised (X,Y) CIE color values for the PL spectrum vary from (0.14, 0.17) for the 2 nm sample to (0.33, 0.51) for the 8 nm sample, which represent the colours blue and yellow-green respectively. The redshift of the emission peak with increasing QW width is generally consistent with a reduction in the quantum confinement energy at larger QW widths. However, the emission continues to redshift as the QW width increases significantly above the Bohr radius of the electrons and holes (approximately 2.6 nm and 0.26 nm, using dielectric constants and effective masses for zb-GaN). This suggests that there is another effect influencing the red-shifting behaviour.

As mentioned previously, SIMS measurements show that, in some examples, sample have and oxygen impurity concentration of the order of $1 \times 10^{19}$ cm$^{-1}$. These oxygen impurities can act as shallow donors in wz-GaN epilayers, which can result in the presence of a relatively higher density of background electrons in the sample, which would partially fill the conduction band (CB). Therefore, the CB filling can, purely in some optional examples, be partially responsible for the large FWHM of the emission. Nevertheless, as mentioned above, larger FWHM are not inherent properties of an oxygen impurity. Preferably, samples have no oxygen impurity present and are still capable of producing polarised emission.

Figure 15:
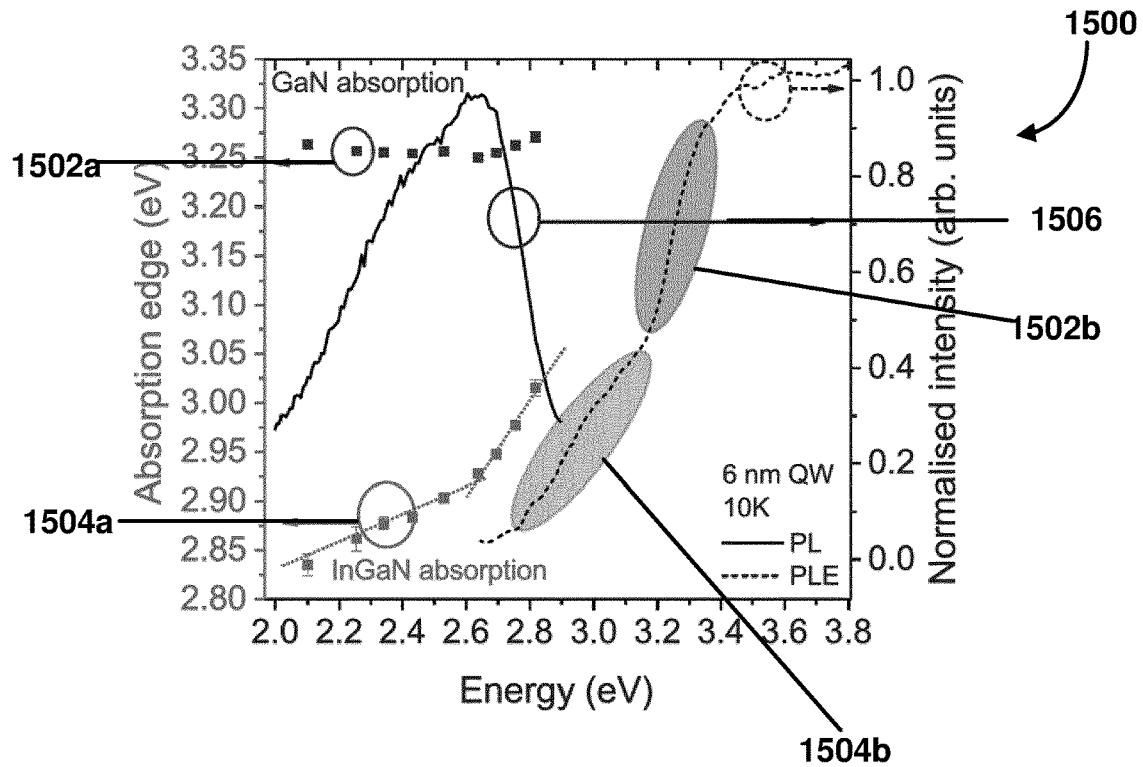
FIG. 15 shows a graph displaying a photoluminescence (PL) spectrum (solid line), produced at 10 K, of a 6 nm width quantum well, and a corresponding PL-excitation (PLE) spectrum (dashed line) that indicates two distinct absorption edges.

FIG. 15 shows a graph 1500 displaying a photoluminescence (PL) spectrum 1506 (solid line) at a temperature, of 10 K sample of a 6 nm thick QW, and a corresponding PL-excitation (PLE) spectrum (dashed line; 1502b, 1504b) detecting the emission at an excitation photon energy of 2.53 eV. The graph further displays characteristic energies of the GaN absorption edge, for each of the PL spectrum 1502a and the PLE spectrum 1502b, and the abs portion edge for the QW (i.e., InGaN) for each of the PL spectrum 1504a and the PLE spectrum 1504b.

When detecting the emission at any wavelength across the PL peak, photon absorption edges can be observed at energies of 3.26 eV and 3 eV. The first absorption edge (at 3.26 eV) corresponds to the photo-generation of carriers in the zb-GaN, which are captured by, and recombine in, the QWs.

The second absorption edge is due to direct absorption of photons in the QWs, where a sigmoidal fit was applied to the PLE spectra 1502b, 1504b to extract characteristic energies. As seen in data points at 1502a in graph 1500, the GaN edge is at a constant energy (3.26 eV) and is close to the bandgap of unstrained zb-GaN (3.3 eV), where this discrepancy (i.e. between 3.26 eV and 3.3 eV) suggests that the zb-GaN is under tensile strain. Nevertheless, it would be understood that tensile strain in zb-GaN is not a characteristic that is required to produce the advantageous results described herein. In contrast, the QW absorption edge (1504a) is not at a constant energy. When detecting on the higher energy peak, the absorption edge shifts with emission energy, with an energy difference of approximately 250 meV between absorption and emission. This is consistent with direct absorption of photons into QWs, generating electron-hole pairs which cool to the ground states before recombining.

For the lower energy peak, the absorption edge shifts at a reduced rate with emission energy and the absorption edge drops close to zero before the onset of emission. This suggests that there are distinct regions in the QWs with different energy levels. For example, these distinct regions could be created with different indium fractions, consistent with the STEM/EDX measurements shown in FIG. 2. There will be little direct photon absorption into these regions due to their small volume and low density of states. Instead, carriers are captured from the rest of the QW into these regions of high indium content: this leads to energy differences up to 800 meV between absorption and emission. Conduction band (CB) filling (for example, due to oxygen impurity) may also contribute to this large energy difference by preventing absorption into the filled low energy CB states, in which the carriers in these filled states can still radiatively recombine. In summary, the large FWHM (between 420 meV and 510 meV, as seen in the subplots of the graph 1400 FIG. 14) of the low energy emission is partially due to the CB filling, and partially due to the variation in the size and indium content of the quantum wires.

The PL spectra in FIG. 12, described in detail above, indicate that two emission bands (i.e., a high energy and a low energy emission band) are present at a temperature of 10 K. This is consistent with all of the samples studied and shown in FIG. 18 described below. For the 2 nm QW, there is a low energy peak centred at 2.67 eV and a high energy peak at 2.86 eV. These energies are higher than the values at room temperature due to the increase in bandgap with decreasing temperature. For the 2 nm QW, and in respect of subplot 1408 of graph 1400, the lower energy peak (e.g. 1202 in FIG. 12) is polarised with a DOLP of 86% in the [1-10] direction, whereas the high energy peak has a DOLP of 37%. As the sample temperature is increased, the higher energy peak quenches at a faster rate than the lower energy peak, such that the polarised lower energy peak dominates in the room temperature PL spectra shown in FIG. 14.

Figure 16:
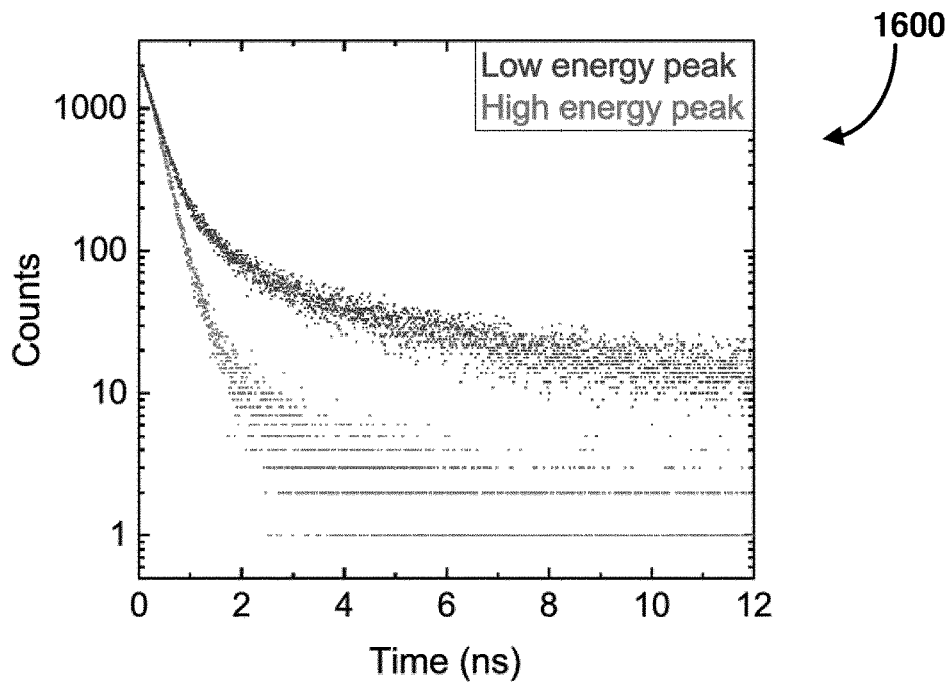
FIG. 16 shows photoluminescence time decays, from a GaN/InGaN crystal at 10 K, produced from a quantum well with a 2 nm width.

FIG. 16 shows a graph 1600 that displays PL time decays measured at a temperature of 10 K, which provides an insight into the recombination mechanisms underlying the two emission bands at low temperature. In detail, FIG. 16 shows photoluminescence time decays, from a GaN/InGaN crystal at 10 K, produced from a quantum well with a 2 nm width. These decays were measured close to the peak of the high energy peak (peak 1204 on FIG. 12), 2.82 eV, and at an energy of 2.43 eV, where the largest component to the PL intensity is from the lower energy peak.

When detecting the emission at the lower energy peak, a separate non-exponential decay component is also observed. This indicates that a different recombination mechanism is contributing to the PL decay at this energy. The non-exponential form may indicate a distribution of different recombination rates with the same emission energy, resulting from recombination of carriers from different local environments. Decay times are discussed in detail below, in respect of FIG. 17. Structural measurements of the QWs offer an explanation for this lower energy emission peak. As seen in FIG. 2 described above, SFs 204 intersect with the QWs 104 on their way to the GaN surface. The EDX measurements, from the sample shown in FIG. 2, indicate that the indium content within a few nm of the SFs is approximately double the indium content in the rest of the QW.

The increased indium content reduces the bandgap in these regions, and since the SFs are planar defects, these regions will extend perpendicular to the plane of the image (in the [1-10] direction) resulting in a quantum-wire (Qwire) one-dimensional nanostructure. FIG. 2 shows that the QWs have been grown on a rough zb-GaN surface, which results in a meandering profile when viewed in the [1-10] direction, but not in the [110] direction. This meandering may also result in an additional contribution to the confinement of the carriers in the quantum wires and in the rest of the QW. Recombination in these indium-rich regions is at a lower energy due to the reduced bandgap in comparison with the rest of the QW.

Additionally, it has been observed that the SFs, which correspond to thin planes of wz-GaN crystal stacking, may further introduce electric fields into the structure due to a difference in spontaneous polarisation between the zb (cubic) and wz (hexagonal) phases. The separation of the SFs affects the magnitude of these fields and will therefore influence the recombination energy of carriers in the indium rich regions, which may contribute to the large FWHM of the emission in the presently described QWs.

Recombination in the quantum wires can also explain the optical polarisation of the low energy emission, as emission from similar structures can be polarised along the length of the Qwire. By changing the cross sectional dimensions of the wire, the DOLP can be changed. Thus, it is possible that the DOLP can be kept relatively constant in respect of different temperatures, by fabricating Qwires with certain cross-sectional dimensions. Simple calculations discussed in relation to FIG. 19 describe examples of which Qwire dimensions may achieve DOLPs which are substantially invariant of temperature. Further advantageously, it may be possible to further maximise the DOLP by increasing the anisotropy in the SF distribution.

The SFs are present on the [111] planes of zb-GaN, which produces nanostructures along both the [110] and [1-10] directions in the QW. If the distribution of the SFs is uniform on all 4 planes then the net optical polarisation perpendicular to the growth direction will be zero. However, as mentioned, the density of SFs is dependent upon the direction of the substrate offcut. This would result in a greater density of SFs in one direction, leading to a net optical polarisation. Additionally, the meandering profile of the QWs is preferentially seen in the [1-10] direction.

Figure 17:
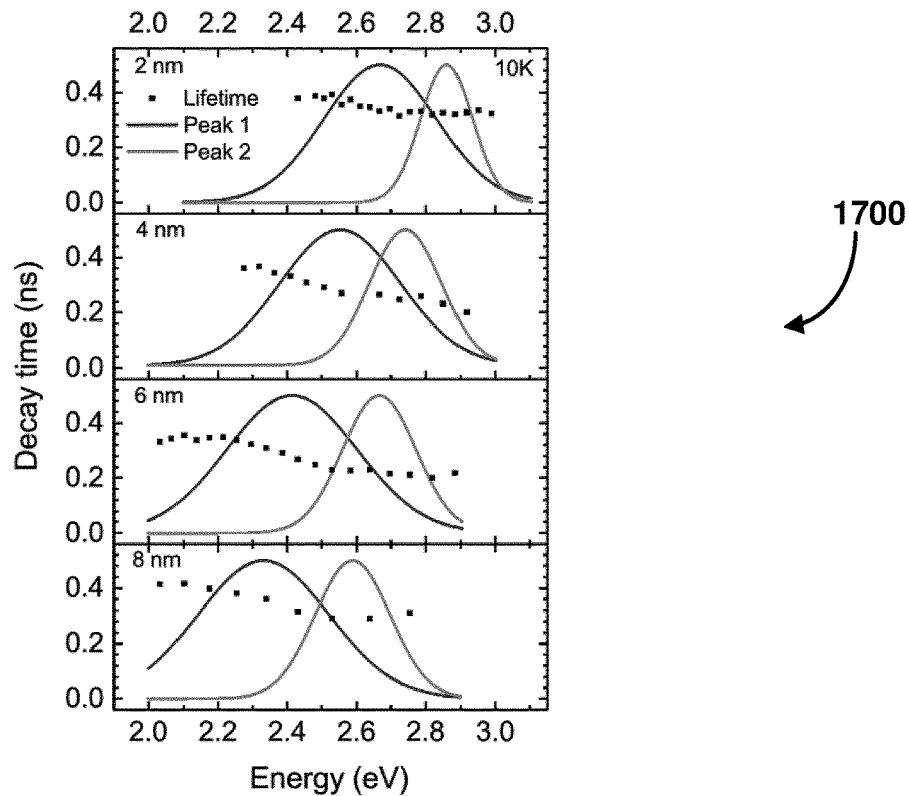
FIG. 17 shows a graph displaying four emission decay times for cubic InGaN/GaN quantum wells of different widths.

FIG. 17 shows a graph 1700 displaying four experimental emission 1/e decay times for cubic InGaN/GaN quantum wells having thicknessess of 2, 4, 6 and 8 nm, produced at a temperature of 10 K. Also included in each subplot are Gaussian peaks representing the peak energy and FWHM of peaks 1 (left-hand curve on each subplot) and 2 (right-hand graph on each subplot) respectively. The PL decay curves were measured for each QW sample (i.e., having thicknessess of 2, 4, 6 and 8 nm) at a temperature of 10 K, where it is assumed that, at a temperature of 10 K, the dynamics are purely radiative. From these decay curves the time taken for the intensity to drop to 1/e of the peak intensity was recorded, and this this measurement repeated for different emission energies across the spectrum.

Figure 18:
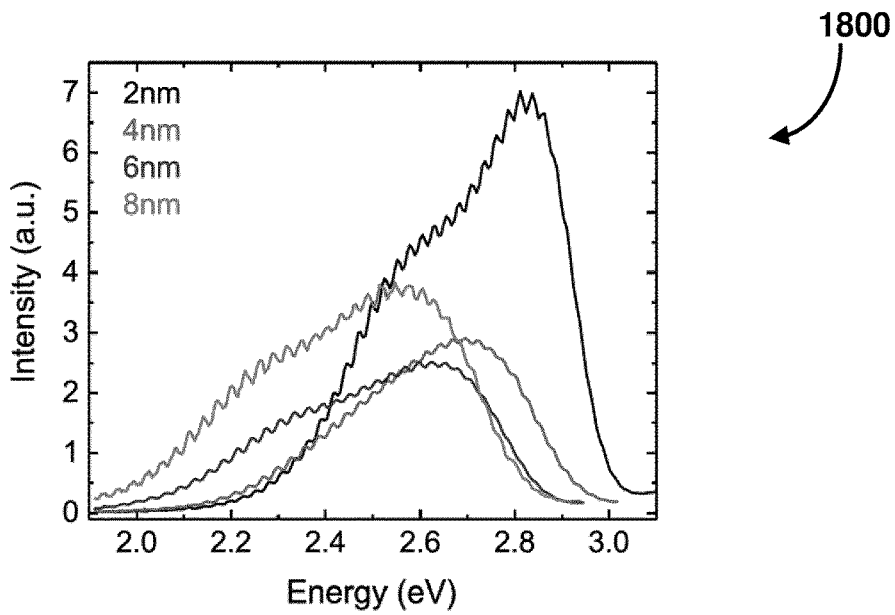
FIG. 18 shows photoluminescence spectra of four cubic InGaN/GaN quantum wells of different widths.

FIG. 18 shows the PL spectra measured at 10 K for samples with QW widths of 2 nm, 4 nm, 6 nm and 8 nm. In each spectrum the two emission peaks are observed, corresponding to emission from the indium-rich regions of the QWs at low energy, and the rest of the QWs at higher energy. There is no trend in the integrated intensity of the emission with QW widths.

On the high energy side of the PL emission, the decay times are 320 ps, 200 ps, 210 ps and 310 ps for increasing QW width, with an error of 10 ps. The decay times measured on the zb-QWs do not show the large variation with QW width expected for polar QWs, which suggests the electric fields are significantly reduced, relative to a corresponding c-plane wurtzite QW. Thus, this is contrary to results obtained from polar c-plane wurtzite InGaN/GaN QWs, where a thicker QW results in a significant increase in the radiative lifetime due to the separation of electrons and holes transverse to the QW by electric fields.

In heterostructures where the electric field is reduced, recombination may involve excitons. In the absence of localisation effects, the radiative lifetime is still dependent upon the QW width due to changes in the exciton binding energy. Another possibility is that the recombination involves holes and an excess of electrons, where the excess of electrons limits the variation in the electron-hole wavefunction overlap with QW width. Additionally, the decay shape is monoexponential, as shown in FIG. 17, where said decay shape is consistent with excitonic recombination.

At the lowest energies there is also no obvious trend in the decay times, which are 375 ps, 365 ps, 330 ps and 410 ps with increasing QW width. The recombination lifetime of the lower energy peak therefore also does not vary significantly with QW width, despite the influence of the SFs creating electric fields in these regions. However, these electric fields are not transverse to the QW, instead in the four possible [111] directions, meaning that the QW width may have little effect on the carrier separation by these fields and therefore minimal effect on the decay times. It will be appreciated that the distance separating the SFs will instead determine the electric fields, and in turn determine the decay times as plotted in graph 1700 in FIG. 17.

Further Modelling of InGaN/GaN Quantum Wells

To determine if carriers can be captured by the regions of high indium content, a three-dimensional model system was developed, as described above in respect of FIG. 8. This system consisted of two intersecting QWs with the same indium content forming a rectangular cross-sectioned quantum wire with double the indium content where they intersect. The dimensions of the QWs were varied, along with the indium content, calculating the ground state energies for electrons and holes using the Numerov method. In the analysis of the model, it was observed that both holes and electrons are confined to the Qwire, and this degree of confinement increases with increasing indium composition and QW width. In most cases, the energy required for the carriers to escape the Qwire into the QW is much greater than the average thermal energy at room temperature (26 meV). Therefore it is possible for these Qwires to trap both electrons and holes.

Mixing of heavy and light holes in Qwires is known to result in the emission of light polarised in different directions. Electron-hole ground state recombination will emit light polarised along the length of the Qwire. At low temperatures and low carrier densities, only the ground states will be occupied, and therefore the overall emission from the Qwires will be polarised. This is consistent with PL measurements in FIG. 12, where the degree of linear polarisation (DOLP) of the Qwire emission at 10 K is 86%. The DOLP will depend upon the cross sectional area of the Qwires, in which narrower Qwires have a higher DOLP. Higher order states confined to the Qwire can emit light polarised orthogonally to the ground state. Therefore, the DOLP of the emission will drop if the higher order states are populated, which may occur at elevated temperatures. Measurements shown in FIG. 15 demonstrate that the DOLP of the Qwire emission at 300 K (i.e., room temperature) is as high as 75% (for the QW with 2 nm width), a drop of roughly 10% relative to Qwire emission at 10 K.

Figure 19:
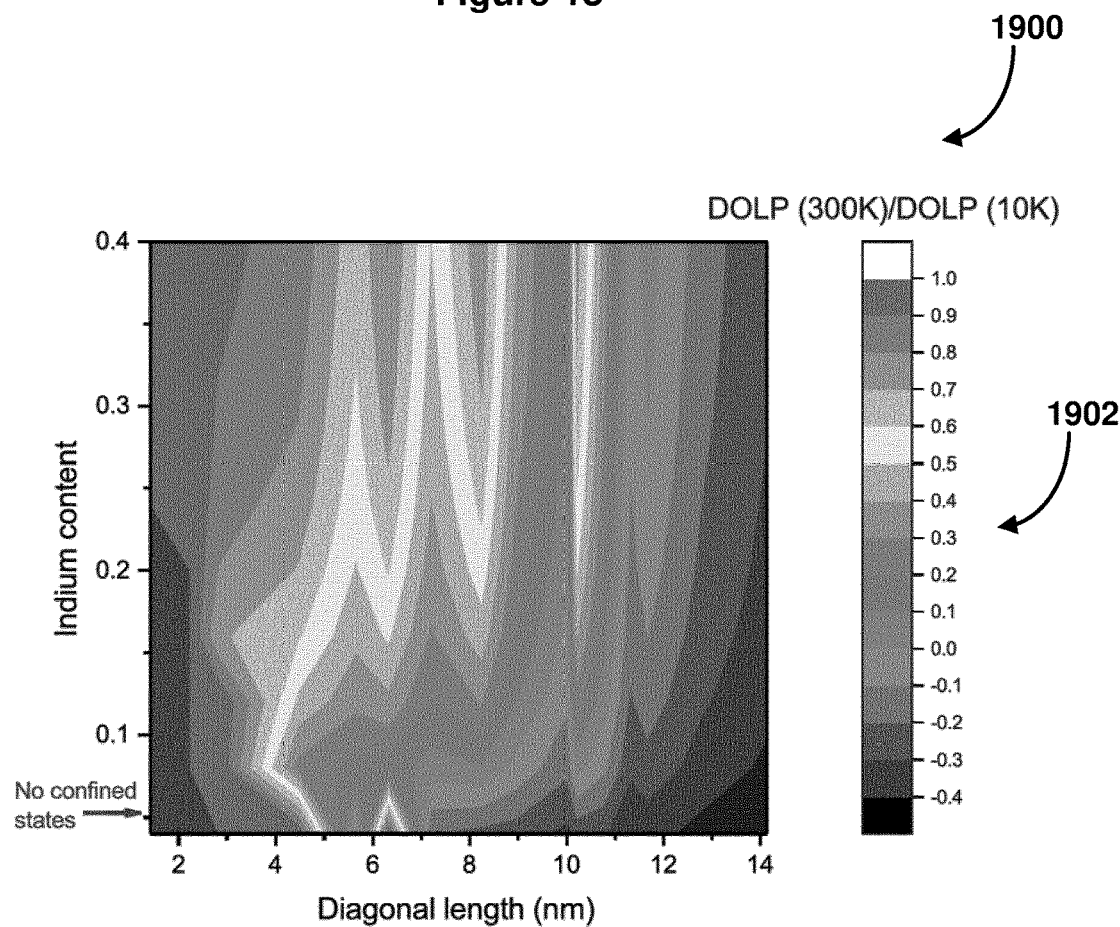
FIG. 19 shows a calculated 2D map of ratios of the degree of linear polarisation (DOLP) for emission from quantum wells at 300 K relative to 10 K, in respect of cubic InGaN/GaN quantum wells having varying indium contents and well dimensions.

FIG. 19 shows a calculated 2D map 1900 of ratios of the degree of linear polarisation (DOLP) for emission from quantum wells at 300 K relative to the DOLP at 10 K, in respect of cubic InGaN/GaN quantum wells having varying indium contents and QW dimensions. The simulation takes account of the thermal equilibrium population of the ground and excited states, and assumes that the recombination rate is unaffected. It can be seen that, for indium contents below 0.25 and a diagonal dimension of less than 2 nm there are no confined states. In other words, for indium contents below 0.25 and a diagonal dimension of less than 2 nm, the degree of linear polarisation (DOLP) for the InGaN/GaN quantum well at 300 K is equal to the DOLP at 10 K, and DOLP is independent of the temperature. Legend 1902 indicates the ratio of DOLP at 300 K to DOLP at 10 K. A negative ratio, corresponding to the lower right portion of graph 1900, indicates that the polarisation is expected to be in the orthogonal direction at room temperature. This orthogonal polarisation concerns QWs having diagonal lengths above 7 nm for low indium contents, and QW widths above 11 nm for high indium contents.

Thus, as shown in FIG. 19, the DOLP can be independent of temperature if there are no excited states in the Qwire, or may weakly depend on temperature if the splitting between the ground and excited states is large compared with the average thermal energy (kT). The energy of these excited states will depend upon the dimensions of the Qwires. To estimate the energy of these excited states, the ground state energies for light holes (taken to have a mass of $0.2\ m_0$) were calculated as the upper limit for these excited states. A slightly improved estimate of the splitting was obtained by halving the separation of the heavy and light hole states, as the excited states lie between these two. The parameters of the system were varied to estimate how this splitting varies with indium content and dimensions of the quantum wire. For an indium content of 0.20, the energy of the $1^{st}$ excited state of the 2 nm Qwires lies above the energy of the bottom of the QW (i.e., the energy required for carriers to escape the Qwire). For all Qwires with a diagonal dimension of 3 nm and greater, the $1^{st}$ excited state is confined below the energy of the bottom of the QW.

Thus, consistent with FIG. 19, only for the narrowest dimensions calculated, the excited state lies above the barrier and therefore is not confined to the quantum wire. In this case, the DOLP will be independent of temperature. As the dimensions of the wire are increased, the splitting reduces from 60 meV to 26 meV. Therefore, at room temperature, the excited state will be populated to a greater extent for wider quantum wires and the DOLP of the emission from wider wires will decrease more as the temperature is increased. Assuming that a thermal equilibrium is reached during the experiment, this dependence was estimated by calculating the occupation of the ground state and 1st excited state at room temperature using Boltzmann statistics.

The ratio of the DOLP at 300 K and 10 K was then estimated for different indium contents and dimensions, by assuming that the recombination rate of each state is identical: the results are shown in graph 1900 in FIG. 19. It is possible to achieve a change in the DOLP that is less than 10% by using quantum wires with a diagonal cross-sectional length less than 3 nm. Therefore, this model 1900 suggests that achieving a small change in the DOLP between 10 K and room temperature is feasible. In general, narrower quantum wires and/or higher indium contents will make the DOLP less dependent upon temperature. The jagged nature of this plot 1900 is due to separate changes in the two dimensions of the cross section, where the data is plotted only against the quadrature sum of these. If one dimension is significantly narrower than the other this results in an increase in the calculated ratio. Darker shaded areas on the right hand side of FIG. 19 demonstrate that the polarisation is expected to be in the orthogonal direction at room temperature for diagonal lengths above 7 nm for low indium contents, and above 11 nm for high indium contents. However, such an effect is unlikely to be observed since the DOLP will reduce to zero with increasing dimensions.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A semiconductor structure comprising:
   a matrix comprising a first cubic Group-III nitride having a first band gap;
   a second cubic Group-III nitride having a second band gap and forming a region embedded within the matrix, wherein the second cubic Group-III nitride comprises an alloying material which reduces the second band gap relative to the first band gap; and
   a quantum wire defined by a portion within the region embedded within the matrix, the portion forming a one-dimensional charge-carrier confinement channel,
   wherein the quantum wire is operable to exhibit emission luminescence which is optically polarised.

2. The semiconductor structure as claimed in claim 1, further comprising:
   a quantum well defined by the region embedded within the matrix, wherein the region forms an embedded layer within the matrix.

3. The semiconductor structure as claimed in claim 1, wherein the matrix comprises cubic Gallium Nitride.

4. The semiconductor structure as claimed in claim 1, wherein the alloying material comprises indium.

5. The semiconductor structure as claimed in claim 1, wherein the portion of the region embedded within the matrix defining the quantum wire comprises a local increase in the concentration of the alloying material.

6. The semiconductor structure as claimed in claim 2, wherein the portion of the region embedded within the matrix defining the quantum wire comprises a local increase in the concentration of the alloying material and wherein the local increase in the concentration of the alloying material is local to an intersection between a stacking fault in the semiconductor structure and the quantum well.

7. The semiconductor structure as claimed in claim 2, wherein the portion of the region embedded within the matrix defining the quantum wire comprises a local fluctuation in a width of the embedded layer defining the quantum well.

8. The semiconductor structure as claimed in claim 7, wherein a dimension of the local fluctuation is greater than about 2 nm.

9. The semiconductor structure as claimed in claim 7, wherein the width of the embedded layer defining the quantum well fluctuates between widths of no less than about 2 nm and no more than about 14 nm.

10. The semiconductor structure as claimed in claim 7, wherein charge carriers confined in the carrier confinement channel of the quantum wire are electrons.

11. The semiconductor structure as claimed in claim 1, wherein the portion of the region embedded within the matrix defining the quantum wire is defined by a channel of the region comprising the alloying material, the channel extending through the matrix.

12. The semiconductor structure as claimed in claim 1, wherein a fraction of the alloying material in the region embedded within the matrix is greater than about 20%.

13. The semiconductor structure as claimed in claim 1, wherein the one dimensional charge-carrier confinement channel of the quantum wire possesses a first electronic state and a second electronic state, wherein a difference in energy between the aforementioned states is greater than a characteristic thermal energy, which reduces a likelihood of a thermally induced transition between the states.

14. The semiconductor structure as claimed in claim 1, wherein an average dimension of the quantum wire is less than around 10 nm, and greater than around 2 nm.

15. A semiconductor device incorporating a semiconductor structure comprising:
a matrix comprising a first cubic Group-III nitride having a first band gap;
a second cubic Group-III nitride having a second band gap and forming a region embedded within the matrix, wherein the second cubic Group-III nitride comprises an alloying material which reduces the second band gap relative to the first band gap; and
a quantum wire defined by a portion within the region embedded within the matrix, the portion forming a one-dimensional charge-carrier confinement channel,
wherein the quantum wire is operable to exhibit emission luminescence which is optically polarised,
wherein the semiconductor device is selected from the group consisting of: a light emitting diode (LED); a vertical cavity surface emitting laser, VCSEL; a laser; and a sensor.

16. A semiconductor device as claimed in claim 15, further comprising:
a substrate comprising cubic silicon carbide;
an electron rich layer of matrix material, disposed on a surface of the substrate; and
an optically active region defined by the matrix and the region embedded within the matrix, disposed on a surface of the electron rich layer; and
an electron deficient layer of matrix material disposed on a surface of the optically active region.

17. A semiconductor device as claimed in claim 16, the semiconductor structure further comprising:
an optical confinement layer disposed on either side of the optically active region.

18. A method of manufacturing a semiconductor device, the method comprising:
forming a matrix comprising a first cubic Group-III nitride having a first band gap;
forming a second cubic Group-III nitride having a second band gap and which forms a region embedded within the matrix, wherein the second cubic Group-III nitride comprises an alloying material which reduces the second band gap relative to the first band gap; and
forming a portion within the region embedded within the matrix defining a quantum wire, the portion forming a one-dimensional charge-carrier confinement channel.

19. The method of manufacturing according to claim 18, further comprising:
forming the region embedded within the matrix as an embedded layer within the matrix, which defines a quantum well.

20. The method of manufacturing according to claim 18, further comprising:
forming a substrate comprising cubic silicon carbide;
forming an electron rich layer of matrix material, disposed on a surface of the substrate;
forming an optically active region defined by the matrix and the region embedded within the matrix, disposed on a surface of the electron rich layer; and
forming an electron deficient layer of matrix material disposed on a surface of the optically active region.

21. A method of manufacturing according to claim 20, further comprising:
forming an optical confinement layer disposed on each of a first and second surface of the optically active region.

* * * * *